(12) United States Patent
Wang et al.

(10) Patent No.: US 6,469,939 B1
(45) Date of Patent: *Oct. 22, 2002

(54) FLASH MEMORY DEVICE WITH INCREASE OF EFFICIENCY DURING AN APDE (AUTOMATIC PROGRAM DISTURB AFTER ERASE) PROCESS

(75) Inventors: Zhigang Wang, San Jose, CA (US); Richard Fastow, Cupertino, CA (US); Sheung-Hee Park, Santa Clara, CA (US); Sameer S. Haddad, San Jose, CA (US); Chi Chang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/969,572

(22) Filed: Oct. 1, 2001

Related U.S. Application Data

(63) Continuation of application No. 09/861,031, filed on May 18, 2001.
(60) Provisional application No. 60/291,861, filed on May 18, 2001.

(51) Int. Cl.[7] ............................................... G11C 16/04
(52) U.S. Cl. .............................. 365/185.28; 365/185.28; 365/185.33
(58) Field of Search ....................... 365/185.28, 185.29, 365/185.33, 185.19, 185.14, 185.27, 185.26

(56) References Cited

U.S. PATENT DOCUMENTS

| | | | | |
|---|---|---|---|---|
| 6,052,310 A | * | 4/2000 | Sunkavalli | 365/185.29 |
| 6,172,909 B1 | * | 1/2001 | Haddad et al. | 365/185.19 |
| 6,275,415 B1 | * | 8/2001 | Haddad et al. | 365/185.11 |

* cited by examiner

Primary Examiner—David Lam
(74) Attorney, Agent, or Firm—Monica H. Choi

(57) ABSTRACT

A source resistor or a positive voltage is coupled to the source and a negative bias voltage is applied at the substrate or p-well of flash memory cells for enhanced efficiency during programming and/or during an APDE (Automatic Program Disturb after Erase) process for a flash memory device. Furthermore, in a system and method for programming the flash memory device, a flash memory cell of the array of multiple flash memory cells is selected to be programmed. A control gate programming voltage is applied to the control gate of the selected flash memory cell, and a bit line programming voltage is applied to the drain of the selected flash memory cell via the common bit line terminal to which the drain of the selected flash memory cell is connected.

48 Claims, 12 Drawing Sheets

|  | 25 degrees Celsius | 90 degrees Celsius | 150 degrees Celsius |
|---|---|---|---|
| $R_S = 5K$ ($V_{SUB} = 0V$) | 240 uA | 260 uA | 250 uA |
| $R_S = 10K$ ($V_{SUB} = 0V$) | 145 uA | 155 uA | 160 uA |
| $R_S = 15K$ ($V_{SUB} = 0V$) | 100 uA | 110 uA | 110 uA |
| $R_S = 5K$ ($V_{SUB} = -1V$) | 200 uA | 210 uA | 210 uA |
| $R_S = 10K$ ($V_{SUB} = -1V$) | 140 uA | 140 uA | 140 uA |
| $R_S = 15K$ ($V_{SUB} = -1V$) | 80 uA | 97 uA | 103 uA |

*FIG. 16*

FLASH MEMORY DEVICE WITH INCREASE OF EFFICIENCY DURING AN APDE (AUTOMATIC PROGRAM DISTURB AFTER ERASE) PROCESS

This patent application is a continuation of an earlier filed copending patent application with Ser. No. 09/861,031 filed on May 18, 2001, for which priority is claimed. This earlier filed copending patent application with Ser. No. 09/861,031 is in its entirety incorporated herewith by reference.

In addition, this patent application claims priority from the provisional patent application with Serial No. 60/291,861 filed on May 18, 2001 and with the same title and inventorship herewith. The provisional patent application with Serial No. 60/291,861 is in its entirety incorporated herewith by reference.

BACKGROUND OF THE INVENTION

1. Field of the Invention

The present invention relates generally to flash memory cells in electrically erasable and programmable memory devices, and more particularly, to an array of flash memory cells with either a resistor coupled to the source or a positive voltage coupled to the source and with a negative voltage coupled to a substrate or p-well, to increase efficiency during an APDE (Automatic Program Disturb after Erase) process or during a programming process.

2. Discussion of the Related Art

One type of programmable memory cell is commonly referred to as a flash memory cell. The structure of one type of flash memory cell includes a source and a drain formed in a silicon substrate. The structure of another type of flash memory cell includes a source and a drain formed in a well that is formed in a silicon substrate. The flash memory cell includes a stacked gate structure formed on the silicon substrate. The region of the silicon substrate beneath the stacked gate structure is known as the channel region of the flash memory cell.

The stacked gate structure of a flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as the tunnel oxide layer.

Prior programming operations on a flash memory cell involve the application of a relatively large constant voltage to the drain of the flash memory cell while an even larger voltage is applied to the control gate. During such programming operations, the source and p-well or substrate of the flash memory cell are maintained at or near ground level in relation to the voltages applied to the control gate and drain.

Such a relatively high voltage potential applied between the drain and source causes electrons to flow through the channel region from the source to the drain. The electrons flowing between the source and drain can attain relatively high kinetic energy levels near the drain. In addition, the high constant voltage applied to the control gate raises the voltage potential of the floating gate to a high level at the start of the programming operation, and a relatively high programming current in the cell being programmed results. Under these conditions, electrons in the channel region having sufficiently high kinetic energy migrate through the tunnel oxide layer and onto the floating gate. This phenomenon is referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of a flash memory cell to cause conduction through the channel region during a read operation on the flash memory cell. The time involved in a programming operation depends upon the rate at which electrons are injected onto the floating gate. As can be appreciated, the slower the rate of injection the longer the programming time to reach the desired threshold voltage.

The microelectronic flash or block-erase Electrically Erasable Programmable Read-Only Memory (Flash EEPROM) includes an array of cells that can be independently programmed and read. The size of each cell and thereby the memory are made small by omitting transistors known as select transistors that would enable the cells to be erased independently. As a result, all of the cells must be erased together as a block.

A flash memory device of this type includes individual Metal-Oxide-Semiconductor (MOS) field effect transistor (FET) memory cells. Each of the FETs includes a source, a drain, a floating gate and a control gate to which various voltages are applied to program the cell with a binary 1 or 0, to read the cells, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell can be programmed by applying programming voltages as follows: a voltage, typically in the range of 8–10 volts to the control gate, a voltage in the range of 4 to 5.5 volts to the drain, grounding the source and grounding the substrate or p-well. As discussed above, these voltages cause hot electrons to be injected from a drain depletion region into the floating gate. Upon removal of the programming voltages, the injected electrons are trapped in the floating gate and create a negative charge therein that increases the threshold voltage of the cell to a value in excess of approximately 4 volts.

In channel hot electron programming, hot electrons created by high lateral fields near the drain junction are injected into the floating gate. As discussed above, typical operating voltages for channel hot electron operation are: $V_D$=4.0–5.5V, $V_G$=8–10V, $V_S$~0 V and $V_{sub}$~0 V. One of the limitations of channel hot electron programming for short channel NOR flash memory arrays is that the unselected cells sharing the same bitline begin to leak current when the high drain voltage is applied to the bitline. This leakage current $I_d$ is due to the Dibl (drain induced barrier lowering) effect in short channel devices. The combination of a large leakage current from the unselected cells and a large programming current from the selected cell being programmed results in unacceptably high total programming currents during device programming operation.

Therefore, what is needed is a method of programming to reduce or eliminate the leakage current for the unselected cells without decreasing the programming speed of the selected bit being programmed.

During the program or erase operations of a flash memory cell, charge carriers are injected into or tunnel out, respectively, of the floating gate structure of the flash memory cell. Such variation of the amount of charge carriers within the floating gate structure alters the threshold voltage of the flash memory cell, as known to one of ordinary skill in the art of flash memory technology. For example, when electrons are the charge carriers that are injected into the floating gate structure for an N-channel flash memory cell, the threshold voltage increases. Alternatively, when electrons are the charge carriers that tunnel out of the floating gate structure, the threshold voltage decreases. These two conditions are used as the two states for storing digital information within the flash memory cell, as known to one of ordinary skill in the art of electronics.

During erasing of the flash memory cells of the array of flash memory cells, charge carriers such as electrons are pulled out of the respective floating gate structure of each flash memory cell to decrease the threshold voltage of each flash memory cell. Typically, same bias voltages are applied at terminals of each of the flash memory cells of the array during this erase process. However, because of variations in the structures of each of the flash memory cells, variations in threshold voltage result across the array of flash memory cells after the erase process, as known to one of ordinary skill in the art of flash memory technology. Thus, some flash memory cells that are "over-erased" in the array attain a lower threshold voltage than desired. A flash memory cell with a lower threshold voltage undesirably has higher leakage current.

An APDE (Automatic Program Disturb after Erase) process corrects for such over-erased flash memory cells, as known to one of ordinary skill in the art of flash memory technology. During such an APDE process, sufficient charge carriers such as electrons are reinjected into the floating gate structure of each flash memory cell of the array after an erase process to restore the threshold voltage of the over-erased flash memory cells.

Referring to FIG. 11, a circuit diagram of a column of array of flash memory cells having 512 rows is illustrated. A first flash memory cell 252 represents one flash memory cell in the column of 512 flash memory cells, and a second flash memory cell 254 represents the other 511 flash memory cells coupled in parallel in the column of 512 flash memory cells. A resistor 258 represents the effective resistance of a pass transistor coupled between the bit line and the drain terminals of the column of flash memory cells. A source resistor 260 is coupled to the source of the flash memory cells. The source terminals of each flash memory cell of a column are coupled together and to a respective source resistor.

During an APDE (Automatic Program Disturb after Erase) process, a bit line APDE (Automatic Program Disturb after Erase) voltage of about 5 Volts provided by a bit line voltage source 262 is applied on the bit line coupled to each drain terminal of the 512 flash memory cells in the column. In addition, a control gate APDE (Automatic Program Disturb after Erase) voltage of about 0.5 Volts provided by a control gate voltage source 264 is applied on each control gate terminal of the 512 flash memory cells in the column. Furthermore, for the APDE process, the source resistor 260 is coupled between the source of each flash memory cell and the ground node 256. Furthermore, in the prior art, each substrate or p-well terminal of the 512 flash memory cells in the column is coupled to the ground node 256 having about 0 Volts during the APDE process. When the flash memory cells are comprised of N-channel flash memory cells, the substrate is a p-well being doped with a P-type dopant.

Referring to FIG. 11, such biases are applied to the column of 512 flash memory cells for a predetermined time period to inject a particular amount of charge carriers such as electrons into the floating gate structure of each flash memory cell to raise the threshold voltage of each flash memory cell in the column of 512 flash memory cells. The longer the time period for applying such bias, the higher the increase in the threshold voltage of each flash memory cell. The higher the threshold voltage of each flash memory cell, the lower the leakage current through each flash memory cell. Such a time period for applying the bias for the APDE (Automatic Program Disturb after Erase) process is termed the "APD" time in the field of flash memory technology.

Further referring to FIG. 11, the first flash memory cell 252 represents the one flash memory cell, of the column of 512 flash memory cells, having a fastest rate of increase in threshold voltage to retain the desired threshold voltage in a shortest time period. The length of the time period for the flash memory cell 252 attaining the desired threshold voltage is affected by the leakage current of the other 511 flash cells 254 in the column of flash memory cells, $I_{leak}$.

Such leakage current is disadvantageous because with such leakage current flowing through the resistors 258 and 260 coupled at the drain and source terminals of the flash memory cells, the resulting voltage across the drain and source terminals of the flash memory cells are lowered. Such lowered voltage across the drain and source terminals decreases the rate of charge carrier injection into the floating gate structure of the flash memory cells for a less efficient APDE (Automatic Program Disturb after Erase) process.

The level of leakage current $I_{leak}$ is especially acute for flash memory cells having scaled down dimensions of hundreds of nanometers for the channel length because of DIBL (Drain Induced Barrier Lowering). For example, when the channel length of each flash memory cell is less than about 0.22 $\mu$m, the DIBL (Drain Induced Barrier Lowering) voltage change at the drain of a flash memory may be greater than about 0.6 Volts. Despite higher leakage current $I_{leak}$ with a smaller flash memory cell, the dimensions of the flash memory cell are desired to be scaled down further for enhanced speed performance and smaller occupied IC area, as known to one of ordinary skill in the art of flash memory technology.

Applying the voltage biases of the APDE (Automatic Program Disturb after Erase) process for a longer period of time (i.e., a higher APD time) ensures a higher average threshold voltage for the column of flash memory cells to minimize leakage current. A predetermined APD time is used for each cycle in the APDE process such that an acceptably low level of leakage current flows through the column of flash memory cells. However, a higher APD time disadvantageously slows down the erasing cycle of the flash memory array.

Thus, a mechanism is desired for minimizing the APD time to achieve an acceptably low level of leakage current flowing through the column of flash memory cells during the APDE (Automatic Program Disturb after Erase) process.

SUMMARY OF THE INVENTION

Accordingly, in a general aspect of the present invention, a source resistor or a positive voltage is coupled to the source and a negative bias voltage is applied at the substrate or p-well of flash memory cells for enhanced efficiency during programming and/or during the APDE (Automatic Program Disturb after Erase) process.

In one embodiment of the present invention, an array of multiple flash memory cells is formed in rows and columns, and a flash memory cell is located at each intersection of a column and a row. Each flash memory cell has a control gate and a floating gate formed over a substrate, and each flash memory cell has a source and a drain formed in the substrate. Each of the drains of the flash memory cells in a column are coupled together as a common bit line terminal. Additionally, each of the sources of the flash memory cells in a column are coupled together as a common source terminal. Furthermore, each of the substrates of the flash memory cells in a column are coupled together as a common substrate terminal.

In a system and method for programming the flash memory device, a flash memory cell of the array of multiple flash memory cells is selected to be programmed. A control gate programming voltage is applied to the control gate of the selected flash memory cell, and a bit line programming voltage is applied to the drain of the selected flash memory cell via the common bit line terminal to which the drain of the selected flash memory cell is connected. A source resistor is coupled to the common source terminal to which the source of the selected flash memory cell is connected. A substrate programming voltage that is a negative voltage is applied to the substrate or p-well of the selected flash memory cell.

The present invention may be used to particular advantage when the flash memory cells are comprised of N-channel field effect transistors, when the substrate programming voltage applied on the substrate of the selected flash memory cell is in a range of from about negative 3 Volts to about negative 0.5 volts, and when the source resistor has a resistance value in a range of from about 2 kilo-ohms to about 50 kilo-ohms, and when the drain voltage is greater than about 4.0 Volts, according to one embodiment of the present invention.

In a system and method for performing an APDE (automatic program disturb after erase) process in the flash memory device according to another embodiment of the present invention, a column of flash memory cells of the array of multiple flash memory cells is selected to be erase-corrected. A control gate APDE (automatic program disturb after erase) voltage is applied to the respective control gate of each flash memory cell of the selected column of flash memory cells. A bit line APDE (automatic program disturb after erase) voltage is applied to the common bit line terminal corresponding to the selected column of flash memory cells. A source resistor is coupled to the common source terminal corresponding to the selected column of flash memory cells. A substrate APDE (automatic program disturb after erase) voltage that is a negative voltage is applied to the common substrate or p-well terminal corresponding to the selected column of flash memory cells.

In another system and method for performing an APDE (automatic program disturb after erase) process in the flash memory device according to a further embodiment of the present invention, a column of flash memory cells of the array of multiple flash memory cells is selected to be erase-corrected. A control gate APDE (automatic program disturb after erase) voltage is applied to the respective control gate of each flash memory cell of the selected column of flash memory cells. A bit line APDE (automatic program disturb after erase) voltage is applied to the common bit line terminal corresponding to the selected column of flash memory cells. A source APDE (automatic program disturb after erase) voltage that is a positive voltage is applied to the common source terminal corresponding to the selected column of flash memory cells. A substrate APDE (automatic program disturb after erase) voltage that is a negative voltage is applied to the common substrate or p-well terminal corresponding to the selected column of flash memory cells.

The present invention may be used to particular advantage when the source is coupled to the control gate for each flash memory cell in a self-biasing configuration during the APDE process such that the control gate APDE voltage is not applied to the respective control gate of each flash memory cell of the selected column of flash memory cells.

In this manner, the voltage formed at the source resistor or the source voltage applied to the source of the flash memory cell minimizes leakage current through a column of flash memory cells during the programming or APDE process. On the other hand, the negative substrate or p-well voltage enhances the lateral field in the channels of the column of flash memory cells to enhance the speed performance of the flash memory cells during the programming or APDE process.

These and other features and advantages of the present invention will be better understood by considering the following detailed description of the invention which is presented with the attached drawings.

BRIEF DESCRIPTION OF THE DRAWINGS

FIGS. 6, 7, and 8 demonstrate the effectiveness of using the programming methods of the present invention, wherein;

FIG. 6 illustrates the measurement methods to determine the values graphed in FIGS. 7 & 8;

FIG. 7 shows the relationship of cell Vt@Vt=1 $\mu$A and program time with varying $V_S$ and $I_{leakage}$ and a constant $V_d$;

FIG. 8 shows the effect of applying a varying substrate bias to the cells during the programming operation in accordance with the present invention;

FIG. 16 shows a table of data including bitline current during an APDE (automatic program disturb after erase) operation for various combinations of resistance value of the source resistor and voltage of the substrate voltage for the column of flash memory cells of FIG. 12 operating at various temperatures;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, and 20 refer to elements having similar structure and function.

DESCRIPTION OF INVENTION

Reference is now made in detail to a specific embodiment or specific embodiments of the present invention that illustrate the best mode or modes presently contemplated by the inventors for practicing the invention.

Figure 1A:
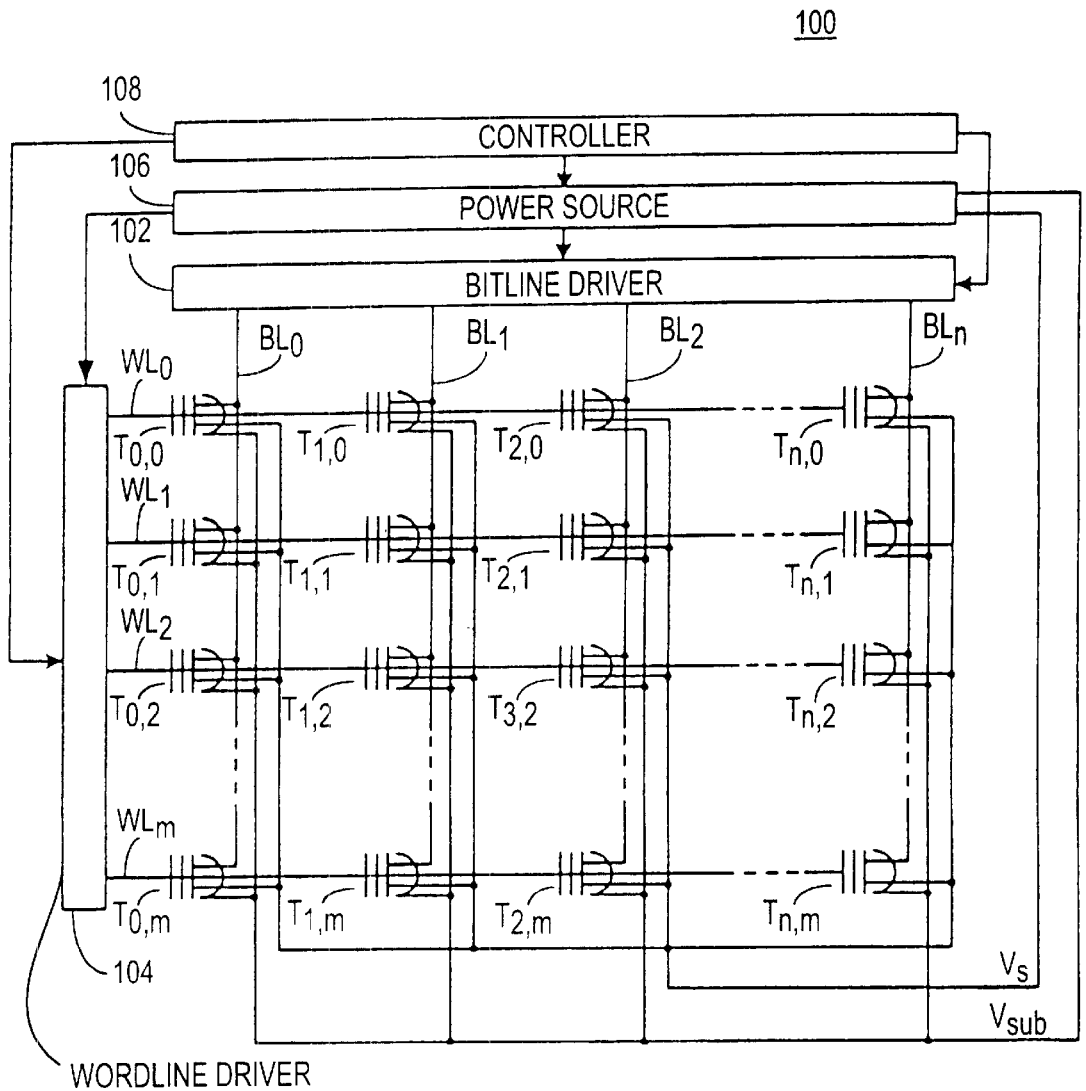
FIG. 1A is a simplified electrical schematic diagram of programmable flash memory EEPROM device.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
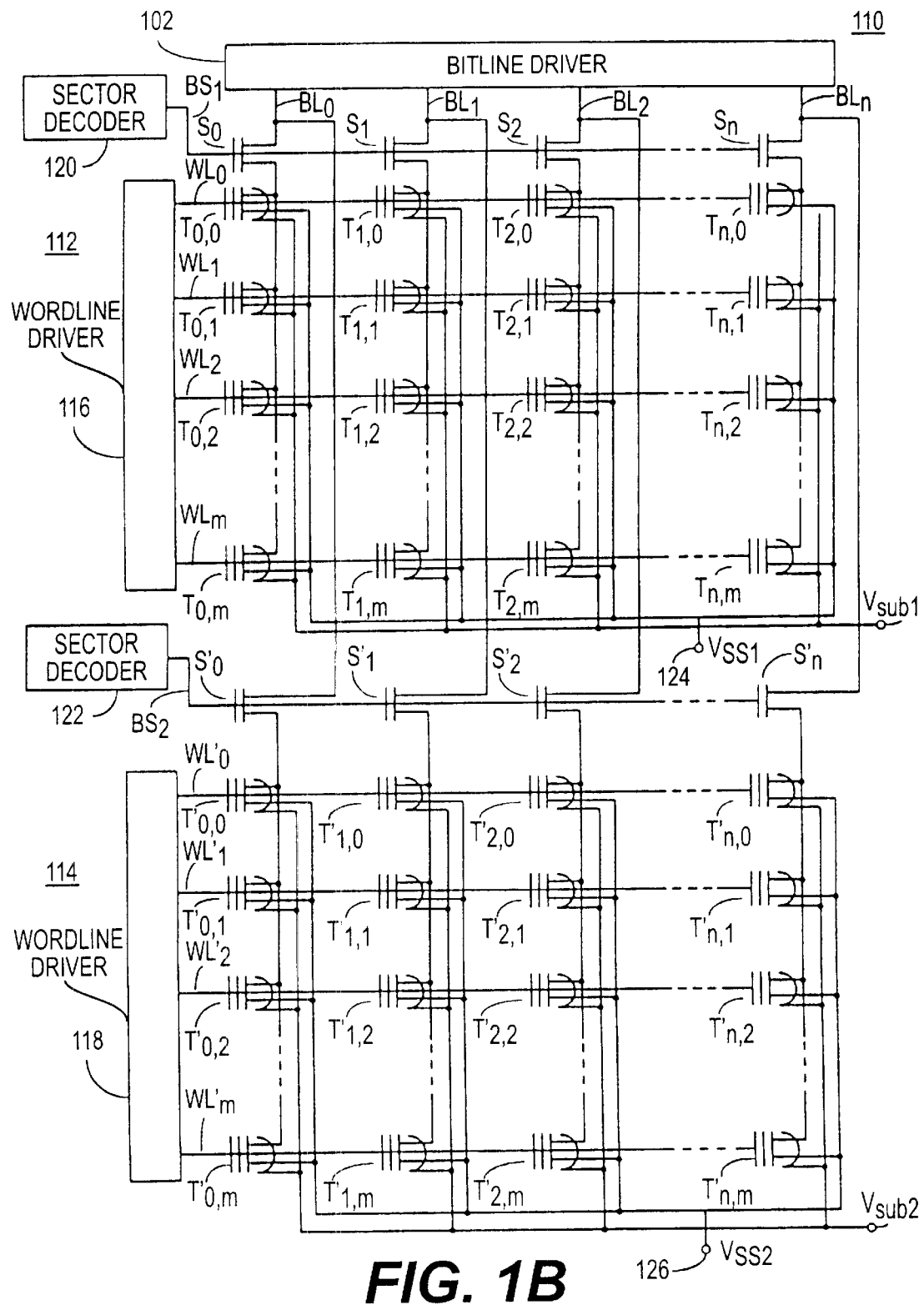
FIG. 1B is similar to FIG. 1A but illustrates a programmable flash memory EEPROM device having cells arranged in two pages, blocks or banks.

FIG. 1B illustrates another flash EEPROM memory 110 that is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select or pass transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122. The sources of the cells in bank 112 are connected to a common source supply voltage $V_{ss1}$ 124 and the sources of the cells in the bank 114 are connected to a common source supply voltage $V_{ss2}$ 126. The p-wells (substrates) of the cells in bank 112 are connected to a common substrate voltage $V_{sub1}$ 125 and the p-wells of the cells in bank 114 are connected to a common substrate voltage $V_{sub2}$ 127.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently or simultaneously.

Figure 2:
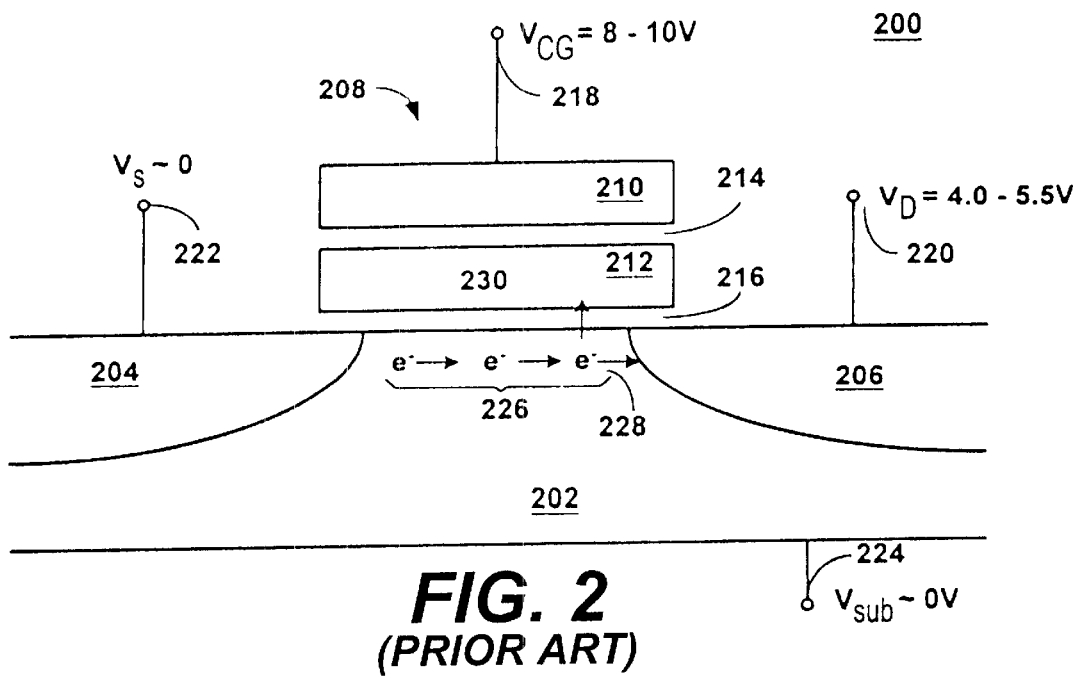
FIG. 2 illustrates the elements of an individual flash memory cell in a programming configuration in accordance with prior art methods.

FIG. 2 illustrates the elements of a flash memory cell 200 with prior art programming voltages applied to the various elements. The flash memory cell 200 is formed in and on a silicon substrate 202. The silicon substrate 200 is typically a p-type substrate in one configuration. In another configuration the silicon substrate can be an n-type substrate. The flash memory cell 200 includes a pair of doped regions 204 & 206 formed in the silicon substrate 202. The doped regions 204 & 206 are $n^+$ type doped regions for the p-type substrate. The doped region 204 functions as a source and the doped region 206 functions as a drain region. The flash memory cell 200 includes a stacked gate structure 208 comprising a control gate 210 and a floating gate 212 separated by a layer 214 of dielectric, typically a layer of silicon dioxide. The floating gate 212 is separated from the upper surface of the substrate 202 by an oxide layer 216, which is also referred to as a layer of tunnel oxide.

When the cell 200 is being programmed, a voltage $V_{CG}$ between 8 and 10 volts is applied to the control gate 210 via the terminal 218, a voltage $V_D$ between 4 and 5.5 volts is applied to the drain region 206 via terminal 220, the source 204 is set to approximately 0 volts via terminal 222 and the substrate 202 is set to approximately 0 volts via terminal 224. The voltage differential $V_{DS} = V_D - V_S$ between the drain 206 and the source 204 causes electron flow through a channel region 226. The electrons $e^-$ 228 are high-energy electrons that have enough energy to migrate through the tunnel oxide 216 onto the floating gate 212. This phenomenon is known as hot carrier injection or hot channel electron programming. The route of the hot electrons from the channel region 226 to the floating gate 212 through the tunnel oxide 216 is indicated by arrow 230.

Figure 3:
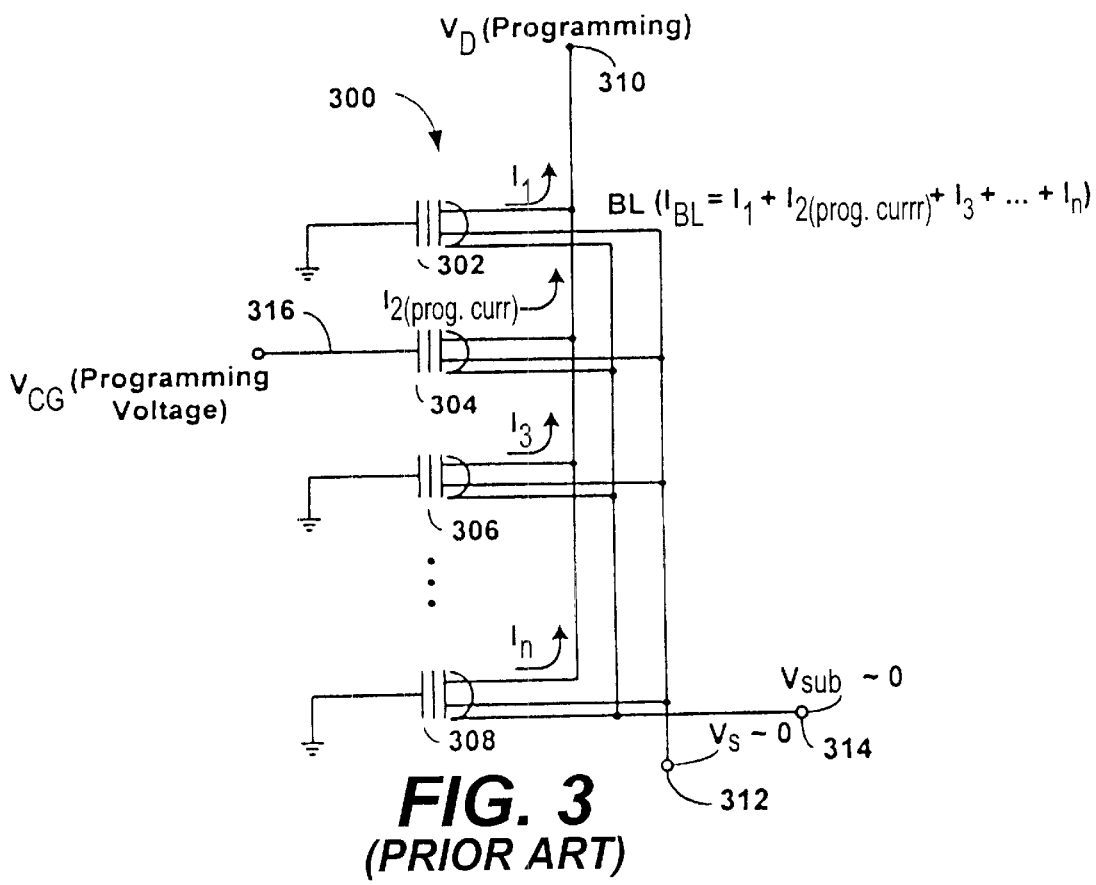
FIG. 3 is a simplified electrical schematic diagram of a column of flash EEPROM cells illustrating the leakage currents occurring during a programming operation in accordance with a prior art method of programming.

FIG. 3 is a simplified electrical schematic diagram of a column 300 of flash EEPROM cells, 302, 304, 306, and 308. A programming voltage $V_D$ of between 4 and 5.5 volts is applied to the drain terminal 310 and the sources of the cells are connected to a common terminal 312 to which a programming voltage of 0 volts is applied. The p-wells of the cells are connected to a common terminal 314 to which a programming voltage of 0 volts is applied. The p-wells of the cells are connected to a common terminal 314 to which a programming voltage of 0 volts is applied. In order to program, for example, cell 304; a programming voltage is applied to the wordline 316 to which cell 304 is connected. A programming current $I_2$ flows through the cell 304 through its source, channel (not shown) and drain. Ideally, the bitline current $I_{BL}$ is equal to only $I_2$. However, if one or more of the unselected cells, for example cells 302, 306, and 308, have low threshold voltages background leakage currents $I_1$, $I_2$, and $I_n$ will flow through the cells 302, 306 and 308, respectively. The bitline current $I_{BL}$ would then be equal to the sum of $I_2$ and the background leakage currents $I_1$, $I_3$ through $I_n$. The leakage currents are caused by the high drain voltage applied to the drain and are due to the drain-induced barrier lowering (DIBL) effect in short channel devices. The combination of a large leakage current from the unselected cells and a large programming current from the selected cell results in unacceptably high total programming currents during device operation.

Figure 4:
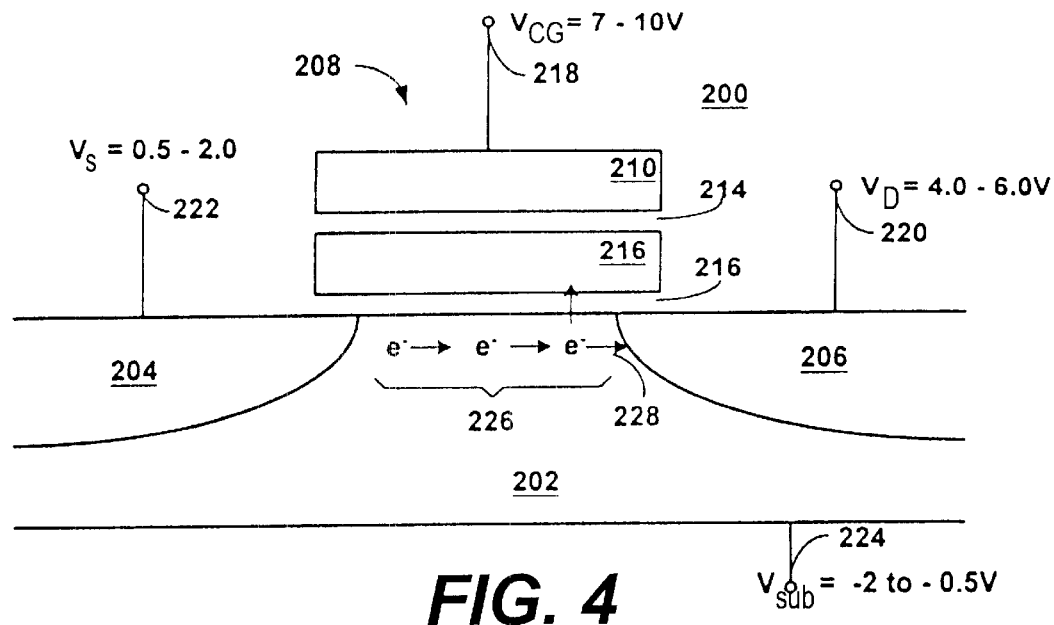
FIG. 4 illustrates the elements of an individual flash memory cell in a programming configuration in accordance with the present invention.

FIG. 4 illustrates the elements of the flash memory cell 200 as shown in FIG. 2 with programming voltages in accordance with the present invention applied to the various elements.

When the cell 200 is being programmed in accordance with the present invention, a voltage $V_{CG}$ between 7 and 10 volts is applied to the control gate 210 via the terminal 218, a voltage $V_D$ between 4 and 6 volts is applied to the drain region 206 via the terminal 220, a voltage $V_S$ between 0.5 and 2 volts is applied to the source region 204 via terminal 222. It should be remembered that all of the sources have a common terminal so that the voltage $V_S$ is applied to the sources of all cells in the block. A voltage $V_{sub}$ between $-2$ and $-0.5$ volts is applied to the substrate 202 via terminal 224. Similarly, it should also be remembered that all of the p-wells (substrate) have a common terminal so that the voltage $V_{sub}$ is applied to the substrates of all of the cells.

Figure 5:
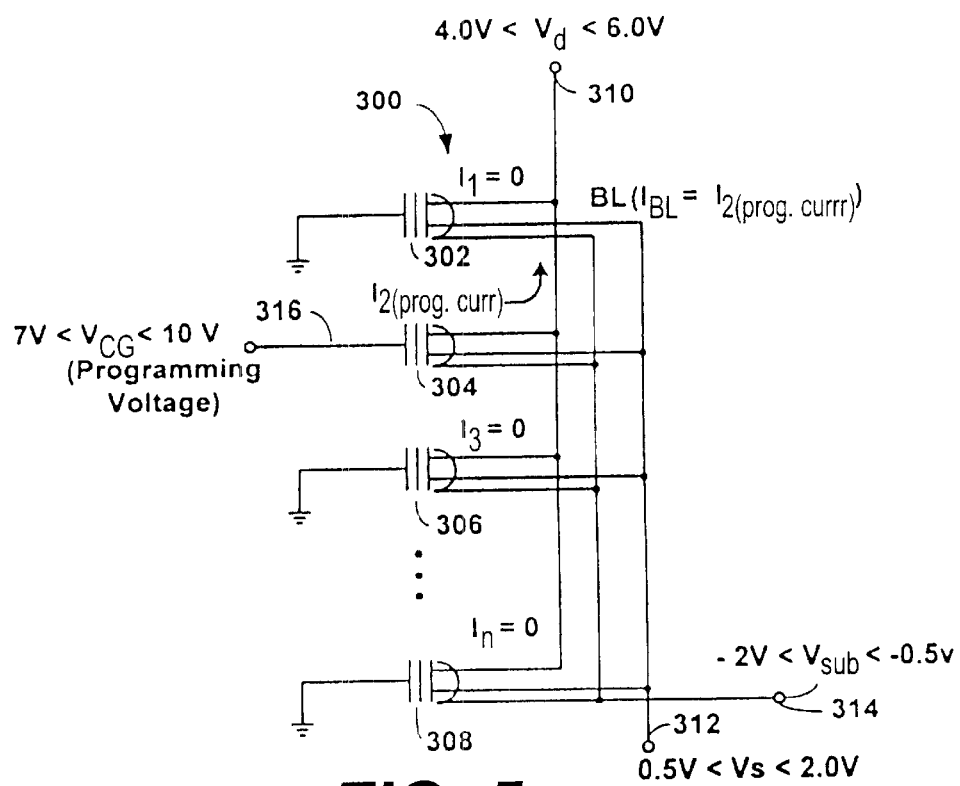
FIG. 5 is a simplified electrical schematic diagram of a column of flash EEPROM cells illustrating the bitline current during a programming operation in accordance with a method of programming in accordance with the present invention.

FIG. 5 is the simplified electrical schematic diagram of the column 300 of flash EEPROM cells as shown in FIG. 3 showing programming voltages applied to the cell terminals in accordance with the present invention. A programming voltage $V_D$ between 4 and 5.5 volts is applied to the drain terminal and the sources of the cells are connected to the common source terminal 312 to which a programming voltage $V_S$ of between 0.5 and 2 volts is applied. A programming voltage $V_{CG}$ between 7 and 10 volts is applied to the wordline 316 to which the gate of the cell being programmed 304 is connected and a programming voltage $V_{sub}$ between $-2$ and $-0.5$ volts is applied to the substrate terminal 314.

The method of programming in accordance with the present invention reduces or substantially eliminates the leakage current for the unselected cells, that is all cells in the column 300, FIG. 5, which typically would be 511 cells that are unselected (512 minus the 1 cell being programmed cell 304, FIG. 5). By selecting the proper combination of programming voltages, the fast programming speed of the selected cell can be maintained. The basic principle of the programming operation of the present invention is to: (1) employ a relatively large source bias voltage during programming in order to back-bias the unselected cells to reduce the column leakage current from the unselected cells; and (2) employ a negative p-well or substrate bias in order to increase the lateral electric field of the cell selected to be programmed, which maintains the fast programming speed under the reduced $V_{DS}$ condition. The drain and gate voltages are similar to the drain and gate voltages used in standard hot electron programming. The selection of the correct programming voltages is critical to substantially eliminate the leakage currents from the unselected cells while maintaining the fast programming speed. The selection of the correct programming voltages can be determined for each type of flash memory device during a parameter precharacterization procedure. The parameter precharacterization procedure can be by computer simulation or empirically.

Figure 6:
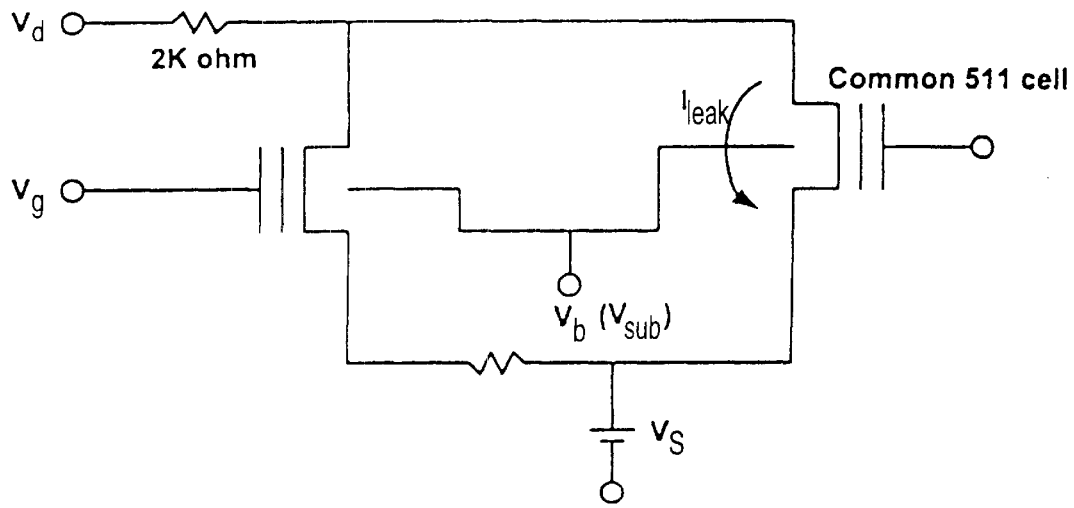

A determination of the effectiveness of using a positive source bias and a negative substrate bias to simultaneously reduce the column leakage while maintaining fast programming speed can be made by utilizing the procedure illustrated in FIG. 6. Measurements were taken on a 512 cell column having varying amounts of column leakage as shown in FIG. 6.

Figure 7:
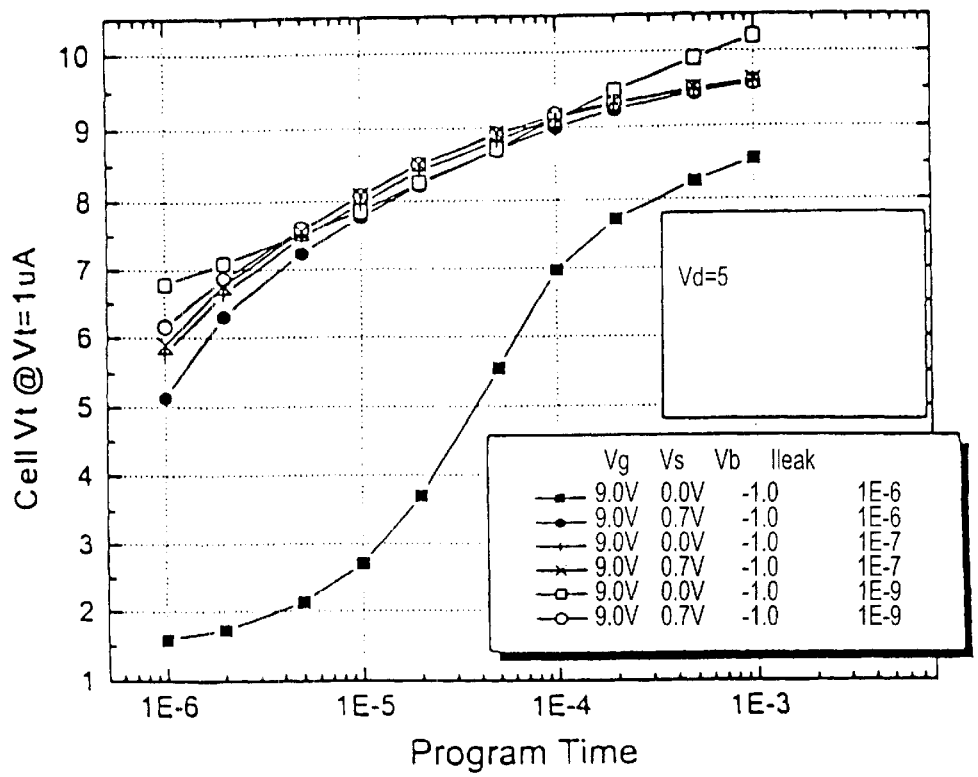

FIG. 7 illustrates that in the case of high column leakage (1E-6) programming is very slow when $V_S = 0$ due to loading resulting in a voltage drop of the drain. FIG. 7 also illustrates that when a source bias of 0.7 volts is applied when $V_{sub}$ is =−1 volts, the column leakage is shut off and the programming speed is fast.

Figure 8:
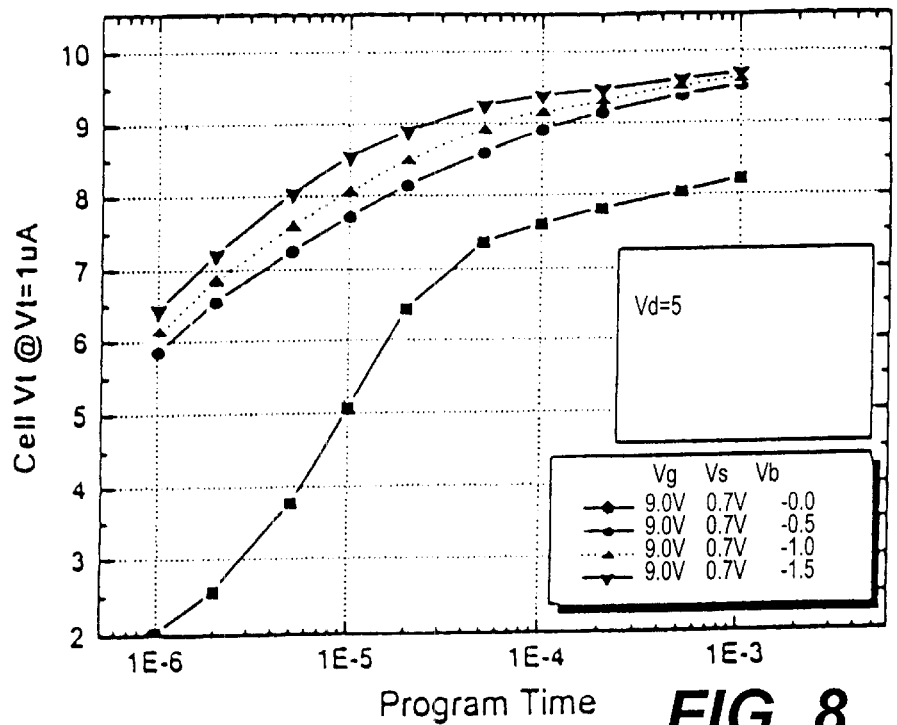

FIG. 8 illustrates the effect of substrate bias. FIG. 8 shows that in order to maintain fast programming speed with a large positive source bias of 0.7 volts, a negative substrate is required.

The inventors have discovered that by applying a positive source bias and a negative substrate bias, it is possible to significantly reduce the column leakage during programming while maintaining fast programming speeds. This method enables channel hot electron programming of short channel devices having Dibl>0.4 volts while maintaining acceptable programming currents.

This method is also applicable to soft programming where typical soft programming voltages would be a $V_{CG}$ voltage between 0.5 and 6.0, a $V_d$ voltage between 4 and 6.0 volts, a $V_S$ between 0.5 and 2 volts and a $V_{sub}$ between −2 and −0.5 volts.

Figure 9:
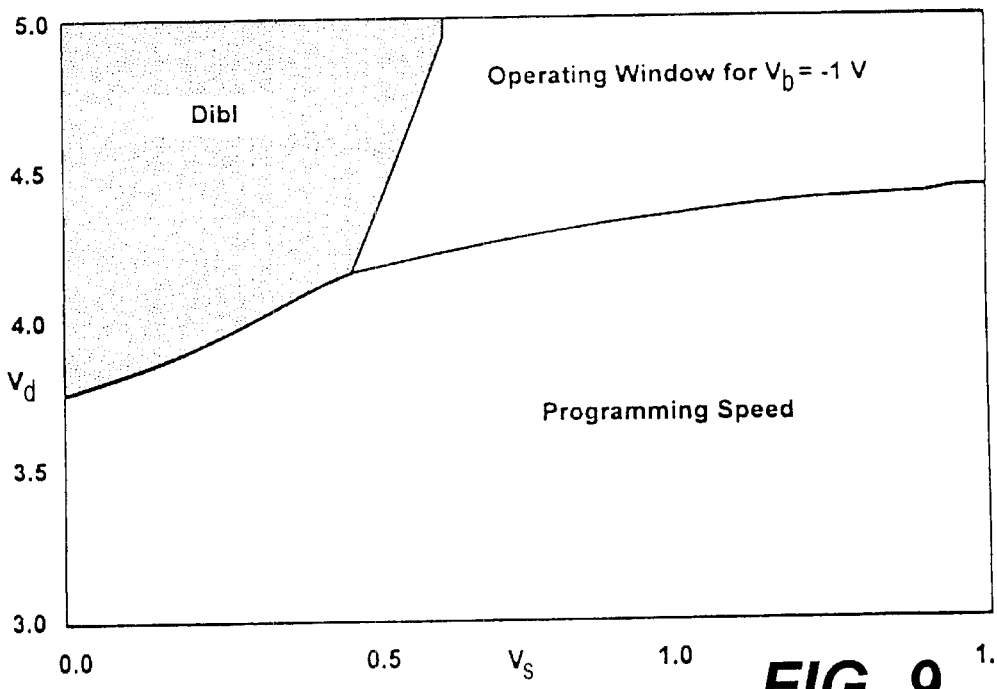
FIG. 9 shows the operating window for a substrate bias $V_b$=−1 V.

FIG. 9 illustrates the operating window (of $V_s$ and $V_d$) to ensure fast programming of a particular short channel device. In this figure, $V_s$ and $V_d$ are varied, while $V_b$ (the substrate voltage) is minus 1 volt. It is shown that a $V_s > 0.5V$ is required in order to reduce the column leakage during programming.

In summary, the described invention thus provides methods of programming and soft programming short channel NOR flash memory cells that reduce the programming currents and column leakages during the programming and soft programming operations.

Figure 10:
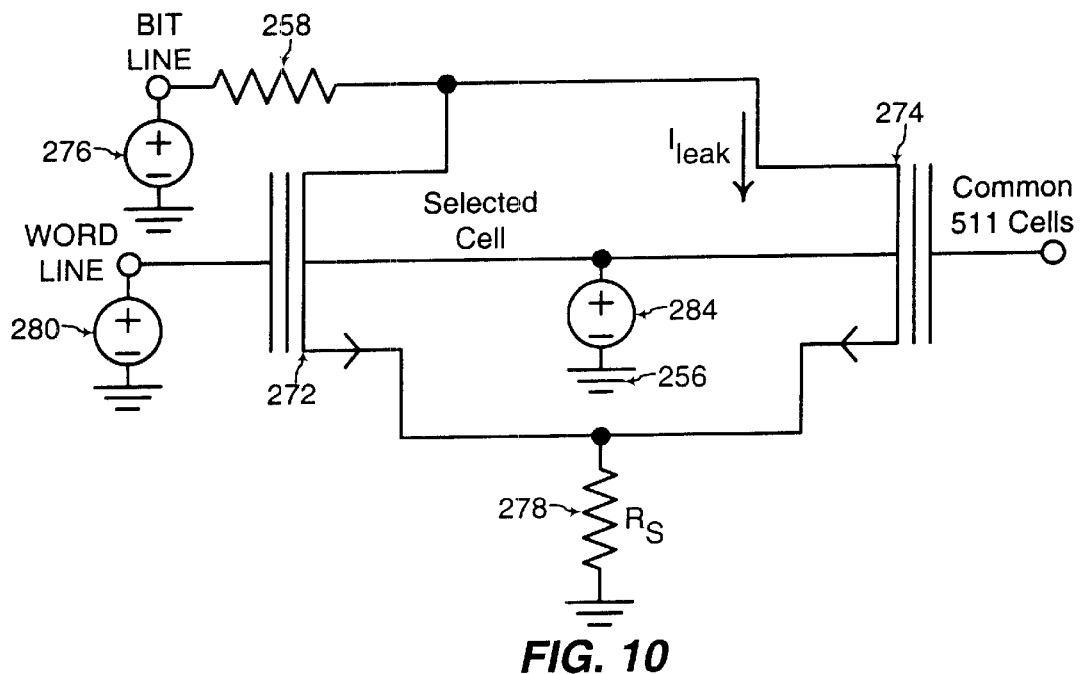
FIG. 10 shows a simplified circuit diagram of a column of flash memory cells illustrating the bitline current during a programming operation with a source resistor coupled to the source and with a negative voltage applied to the substrate or p-well, of each flash memory cell of the column of flash memory cells, according to an embodiment of the present invention.
Figure 11:
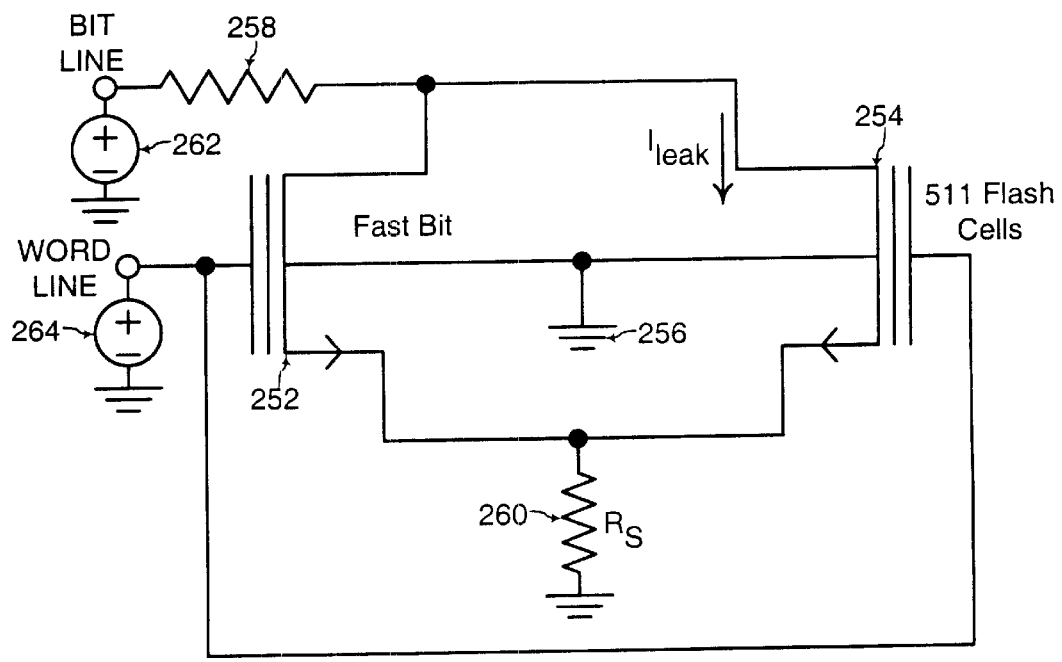
FIG. 11 shows a simplified circuit diagram of a column of flash memory cells illustrating the bitline current during an APDE (automatic program disturb after erase) operation with a source resistor coupled to the source and with the ground node coupled to the substrate or p-well, of each flash memory cell of the column of flash memory cells, according to the prior art.

According to another embodiment of the present invention, FIG. 10 is a simplified electrical schematic diagram of the column 300 of flash EEPROM cells as shown in FIG. 3 showing programming voltages applied to the terminals of the column of flash memory cells. In FIG. 10, the flash memory cell 272 represents the one flash memory cell, in the column of 512 flash memory cells, that is selected to be programmed, and the flash memory cell 274 represents the other 511 flash memory cells of the column of flash memory cells that are not selected while the selected flash memory cell 272 is being programmed. Referring to FIGS. 1A and 10, the controller 108 selects the flash memory cell 272 to be programmed. Technology for implementing such a controller 108 is known to one of ordinary skill in the art of flash memory devices.

In one embodiment of the present invention, the column of flash memory cells of FIG. 10 are comprised of N-channel field effect transistors, and a bit line programming voltage $V_D$ between about 4 and 6 volts is provided by a bit line voltage source 276 and is applied to the bit line terminal corresponding to the column of flash memory cells of FIG. 10. The sources of the column of flash memory cells are connected together and to a source resistor 278. The source resistor 278 has a resistance value of from about 2 kilo-Ohms to about 50 kilo-Ohms, according to one embodiment of the present invention. In addition, a substrate programming voltage $V_{sub}$ between −3 and −0.5 volts is provided by a substrate voltage source 284 and is applied to the substrates of the column of flash memory cells, according to one embodiment of the present invention. The substrates or p-wells of the column of flash memory cells are connected together and to the substrate voltage source 284.

Furthermore, a control gate programming voltage $V_{CG}$ between 7 and 10 volts is provided by a control gate voltage source 280 and is applied to the wordline corresponding to the control gate of the selected flash memory cell 272. On the other hand, the wordlines corresponding to the 511 flash memory cells 274 that are not selected are coupled to a ground node.

The relatively large resistance value of the source resistor 278 in this embodiment of the present invention of FIG. 10 reduces or substantially eliminates the leakage current flowing through the unselected flash memory cells 274 during programming of the selected flash memory cell 272. Yet, with the negative substrate voltage, the fast programming speed of the selected cell is maintained. The basic principle of the programming operation of this embodiment of the present invention is to: (1) couple a relatively large source resistance to the sources of the column of flash memory cells during programming in order to reduce the column leakage current from the unselected cells; and (2) employ a negative p-well or substrate bias in order to increase the lateral electric field of the cell selected to be programmed, which maintains the fast programming speed under the reduced $V_{DS}$ condition. The drain and gate voltages are similar to the drain and gate voltages used in standard hot electron programming.

With proper selection of the correct programming voltages and the correct resistance value of the source resistor 278, the leakage currents from the unselected cells may be substantially eliminated while maintaining the fast programming speed. The selection of the correct programming voltages and the correct resistance value of the source resistor 278 can be determined for each type of flash memory device during a parameter precharacterization procedure. The parameter precharacterization procedure can be by computer simulation or empirically.

The circuit configuration of FIG. 10 may also be used for soft programming. In that case, a bit line programming voltage $V_D$ between about 4 and 6.0 volts is provided by the bit line voltage source 276 and is applied to the bit line terminal corresponding to the column of flash memory cells of FIG. 10. The sources of the column of flash memory cells are connected together and to the source resistor 278. The source resistor 278 has a resistance value of from about 2 kilo-Ohms to about 50 kilo-Ohms, according to one embodiment of the present invention. In addition, a substrate programming voltage $V_{sub}$ between −3 and −0.5 volts is provided by the substrate voltage source 284 and is applied to the substrates of the column of flash memory cells, according to one embodiment of the present invention. The substrates of the column of flash memory cells are connected together and to the substrate voltage source 284. Furthermore, for soft programming, a control gate programming voltage $V_{CG}$ between 0.5 and 6.0 volts is provided by the control gate voltage source 280 and is applied to the wordline corresponding to the control gate of the selected flash memory cell 272. On the other hand, the wordlines corresponding to the 511 flash memory cells 274 that are not selected are coupled to a ground node.

During such soft programming, the relatively large resistance value of the source resistor 278 in this embodiment of the present invention of FIG. 10 reduces or substantially eliminates the leakage current flowing through the unselected flash memory cells 274 during soft programming of the selected flash memory cell 272. Yet, with the negative substrate or p-well voltage, the fast soft programming speed of the selected cell is maintained.

Figure 12:
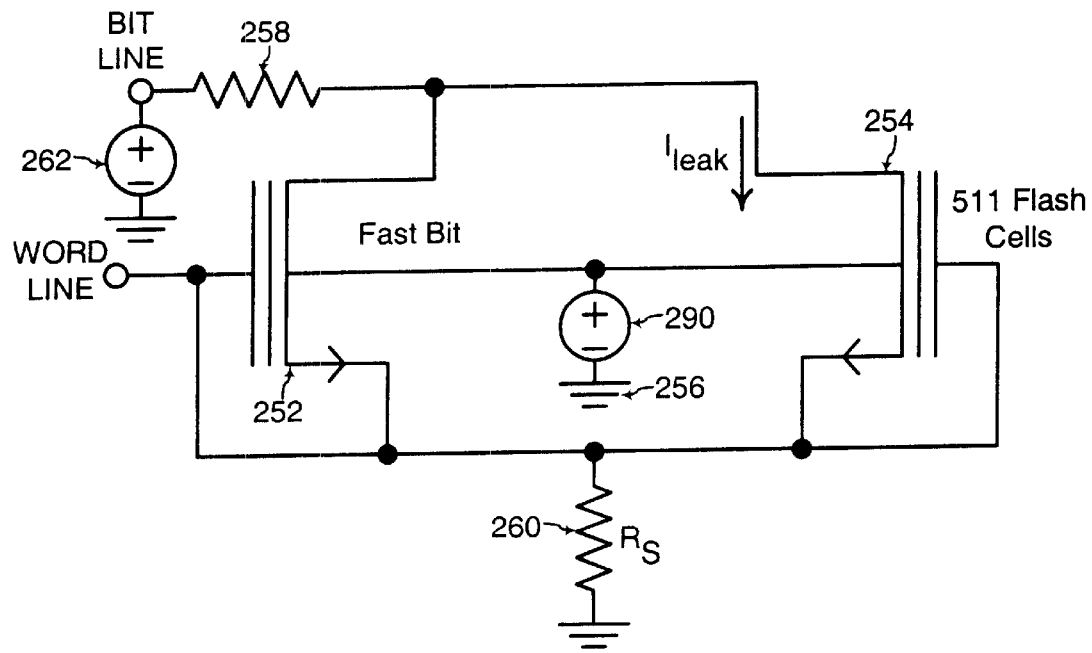
FIG. 12 shows a simplified circuit diagram of a column of flash memory cells illustrating the bitline current during an APDE (automatic program disturb after erase) operation with a source resistor coupled to the source and with a negative voltage applied to the substrate or p-well, of each flash memory cell of the column of flash memory cells coupled in a self-biasing configuration, according to an embodiment of the present invention.

According to a further embodiment of the present invention, FIG. 12 is a simplified electrical schematic diagram of a column of flash memory cells showing APDE (automatic program disturb after erase) voltages applied to the terminals of the column of flash memory cells. The APDE (automatic program disturb after erase) operation corrects for any "over-erase" from the erase operation of the flash memory device, as described herein. During the APDE operation, a column to be erase-corrected is selected at a time. Referring to FIGS. 1A and 12, the controller 108 selects the column of flash memory cells to be erase-corrected in the APDE operation. Each column of the flash memory device is selected a column at a time until the whole flash memory device has been erase-corrected. Technology for implementing such a controller 108 is known to one of ordinary skill in the art of flash memory devices.

FIG. 12 shows one column of 512 flash memory cells selected to be erase-corrected at a given time during the APDE operation. The first flash memory cell 252 represents one flash memory cell in the column of 512 flash memory cells, and the second flash memory cell 254 represents the other 511 flash memory cells coupled in parallel in the column of 512 flash memory cells. The first flash memory cell 252 represents the one flash memory cell, of the column of 512 flash memory cells, having a fastest rate of increase in threshold voltage to retain the desired threshold voltage in a shortest time period. Even after the fast flash memory cell 252 attains a high enough threshold voltage such that the leakage current through that cell 252 is negligible, the other 511 flash cells 254 in the column of flash memory cells still have a total leakage current $I_{leak}$.

Further referring to FIG. 12, the sources of the column of flash memory cells are coupled together and to the source resistor 260. The source resistor 260 has a resistance value of from about 2 kilo-Ohms to about 50 kilo-Ohms according to an embodiment of the present invention. In addition, the substrates (or the p-wells) of the column of flash memory cells are coupled together and to a substrate voltage source 290. The substrate voltage source 290 applies such a substrate APDE voltage in a range of from about −3 Volts to about −0.5 Volts at the substrate or p-well terminals of each flash memory cell of the column in one embodiment of the invention.

Further referring to FIG. 12, in one embodiment of the present invention, a bit line APDE voltage $V_D$ between about 4 and 6 volts is provided by the bit line voltage source 262 and is applied to the bit line terminal corresponding to the selected column of flash memory cells of FIG. 12. Furthermore, in a self-biasing configuration of FIG. 12, the respective source is feed-back coupled to the respective control gate in each flash memory cell, and the respective wordline corresponding to each flash memory cell remains floating. With such a self-biasing configuration, a control gate voltage of about 0.5 Volts is attained for each flash memory cell in the selected column of flash memory cells in FIG. 12.

With such bias during the APDE process, sufficient charge carriers such as electrons are reinjected into the floating gate structure of each flash memory cell of the selected column of flash memory cells of FIG. 12 after an erase process to restore the threshold voltage of the over-erased flash memory cells. Applying such voltage bias of the APDE process for a longer period of time (i.e., a higher APD time) ensures a higher average threshold voltage for the selected column of flash memory cells to minimize leakage current. A predetermined APD time is used for each cycle in the APDE process such that an acceptably low level of leakage current flows through the column of flash memory cells. However, a higher APD time disadvantageously slows down the erasing cycle of the flash memory array.

Figure 14:
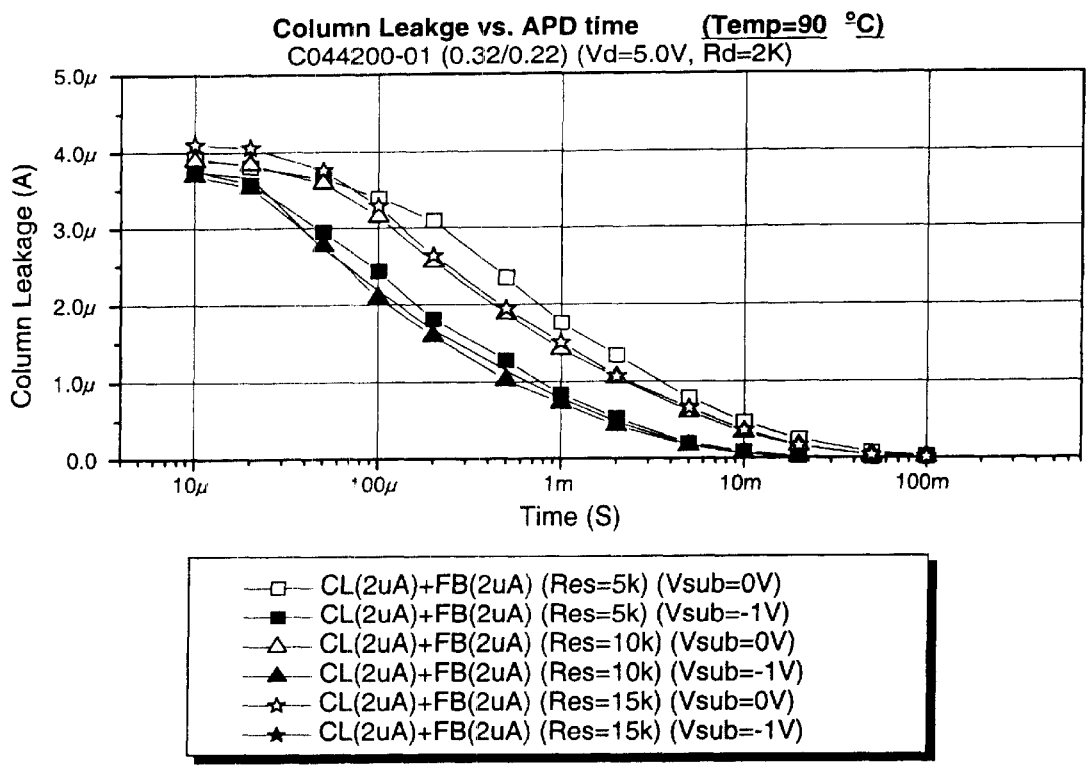
FIG. 14 shows a plot of the bitline leakage current versus APD (automatic program disturb) time for the column of flash memory cells of FIG. 12 operating at a temperature of about 90° Celsius.
Figure 15:
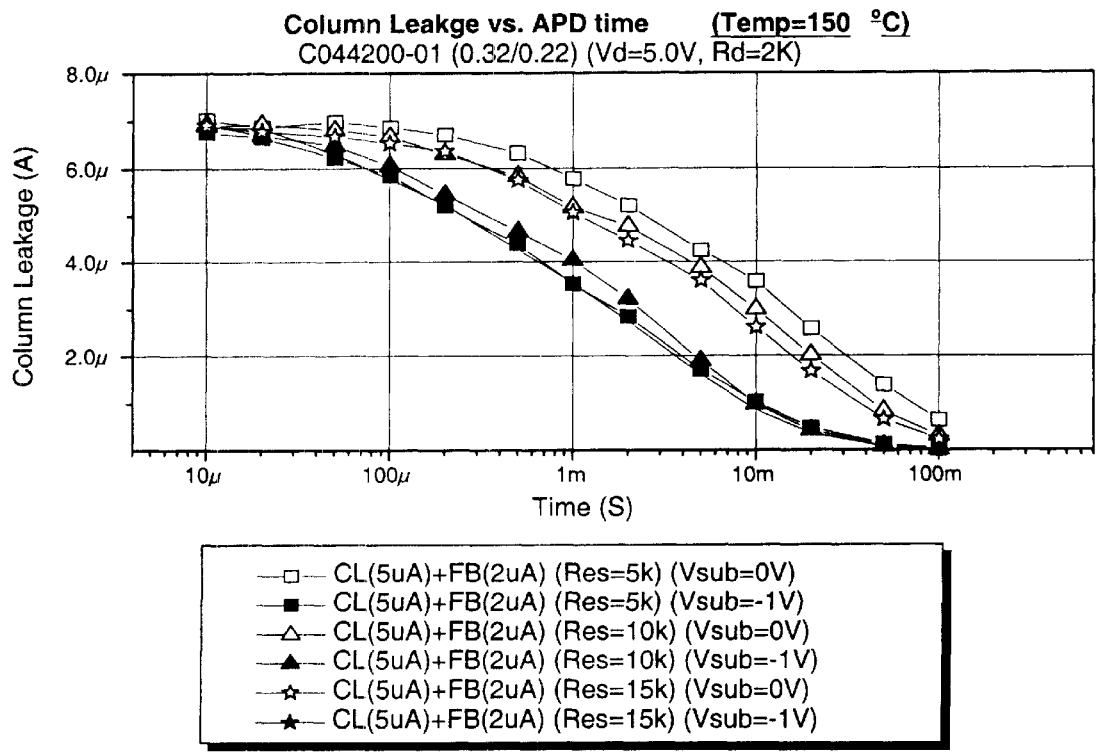
FIG. 15 shows a plot of the bitline leakage current versus APD (automatic program disturb) time for the column of flash memory cells of FIG. 12 operating at a temperature of about 150° Celsius.

FIG. 14 shows a plot of the column leakage current versus the APD time at a temperature of about 90° Celsius for various resistance values of the source resistor 260 and various voltages applied at the substrates of the column of flash memory cells of FIG. 12. FIG. 15 shows a plot of the column leakage current versus the APD time at a temperature of about 150° Celsius for various resistance values of the source resistor 260 and various voltages applied at the substrates of the column of flash memory cells of FIG. 12. FIGS. 14 and 15 illustrate that the column leakage current through the selected column of flash memory cells decreases with a higher APD time. In addition, in FIGS. 14 and 15, the APD time for achieving a column leakage current is lower when a substrate APDE voltage of −1 Volts is applied than when a voltage of 0 Volts is applied to the substrates of the selected column of flash memory cells for various resistance values of the source resistor 260.

FIG. 16 shows a table of column leakage current through the selected column of flash memory cells for various resistance values of the source resistor 260 and various voltages applied at the substrates of the column of flash memory cells at various temperatures. FIG. 16 shows that the bitline current during APDE decreases with a higher resistance value of the source resistor 260 for a fixed substrate voltage for any temperature. In addition, the table of FIG. 16 shows that the bitline current during APDE decreases with a more negative substrate voltage for a fixed resistance value of the source resistor 260 for any temperature.

Thus, the data of FIGS. 14, 15, and 16 indicate that the relatively large resistance value of the source resistor 260 in this embodiment of the present invention reduces or substantially eliminates the bit line current during the APDE operation of the selected column of flash memory cells of FIG. 12. Yet, with the negative substrate voltage, a faster APDE speed is maintained. The basic principle of the APDE operation of this embodiment of the present invention is to: (1) couple a relatively large source resistance to the sources of the column of flash memory cells during the APDE operation in order to reduce the bitline current through the selected column of flash memory cells; and (2) employ a negative p-well or substrate bias in order to increase the lateral electric field of the selected column of flash memory cells during the APDE bias, which maintains the fast APDE speed under the reduced $V_{DS}$ condition.

Figure 13:
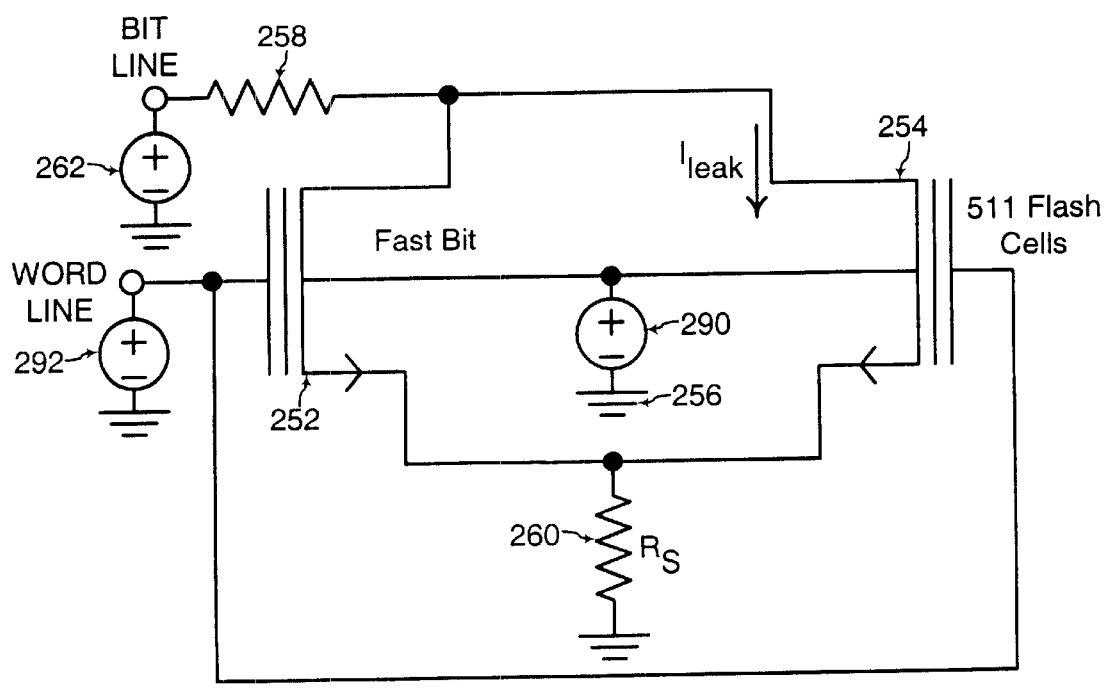
FIG. 13 shows a simplified circuit diagram of a column of flash memory cells illustrating the bitline current during an APDE (automatic program disturb after erase) operation with a source resistor coupled to the source, with a negative voltage applied to the substrate or p-well, and with an APDE voltage applied to the control gate of each flash memory cell of the column of flash memory cells, according to an embodiment of the present invention.

Application of the APDE bias voltages of FIG. 12 are repeated for each column of the array of flash memory cells requiring over-erase correction. In one embodiment of the present invention, application of the APDE bias voltages of FIG. 12 are repeated for each column of the array of flash memory cells until the APDE process is performed for the whole array of flash memory cells requiring over-erase correction. In FIG. 12, the source is feedback coupled to the control gate that is floating for each flash memory cell in the self-biasing configuration. Referring to FIG. 13, in another embodiment of the present invention, a control gate APDE voltage is directly applied on the respective word line for each of the flash memory cell in the selected column of flash memory cells. FIG. 13 shows the column of 512 flash memory cells selected to be erase-corrected at a given time during the APDE operation.

In the configuration of FIG. 13, the word line is not coupled to the source such that the flash memory cells are not self-biasing during the APDE process. Rather, a control gate voltage source 292 provides a control gate APDE voltage that is applied to each respective wordline coupled to each control gate of the selected column of flash memory cells. The control gate APDE voltage is about 0.5 Volts for each flash memory cell in the selected column of flash memory cells according to one embodiment of the present invention.

In the embodiment of FIG. 13, the relatively large resistance value of the source resistor 260 reduces or substantially eliminates the column leakage current during the APDE operation of the selected column of flash memory cells. Yet, with the negative substrate voltage of −3 Volts to about −0.5 Volts applied to the substrates, a faster APDE speed is maintained, similar to the embodiment of FIG. 12.

Figure 17:
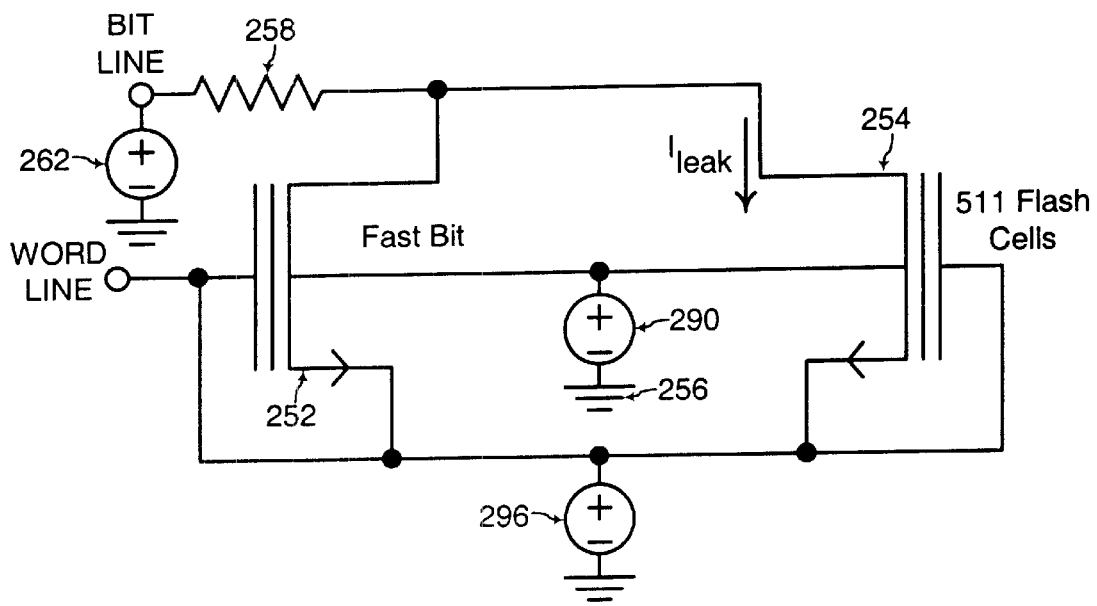
FIG. 17 shows a simplified circuit diagram of a column of flash memory cells illustrating the bitline current during an APDE (automatic program disturb after erase) operation with a positive voltage applied to the source and with a negative voltage applied to the substrate or p-well, of each flash memory cell of the column of flash memory cells coupled in a self-biasing configuration, according to an embodiment of the present invention.

FIG. 17 shows the column of 512 flash memory cells selected to be erase-corrected at a given time during the APDE operation according to another embodiment of the present invention. Comparing FIGS. 12 and 17, instead of the source resistor 260 of FIG. 12, the sources of the selected column of flash memory cells are coupled together and to a source voltage source 296. In one embodiment of the present invention, a bit line APDE voltage $V_D$ between about 4 and 6 volts is provided by the bit line voltage source 262 and is applied to the bit line terminal corresponding to the selected column of flash memory cells of FIG. 17. Furthermore, a source APDE voltage between 0.5 and 2 volts is provided by the source voltage source 296. In addition, a substrate APDE voltage $V_{sub}$ between −3 and −0.5 volts is provided by the substrate voltage source 290 and is applied to the substrates of the selected column of flash memory cells.

Such APDE bias of FIG. 17 reduces or substantially eliminates the column leakage current while maintaining high APDE speed. The basic principle of the APDE operation of this embodiment of the present invention is to: (1) employ a relatively large source bias voltage during the APDE operation in order to back-bias the flash memory cells to reduce the column leakage current; and (2) employ a negative p-well or substrate bias in order to increase the lateral electric field of the flash memory cells, which maintains the fast APDE speed under the reduced $V_{DS}$ condition.

Figure 19:
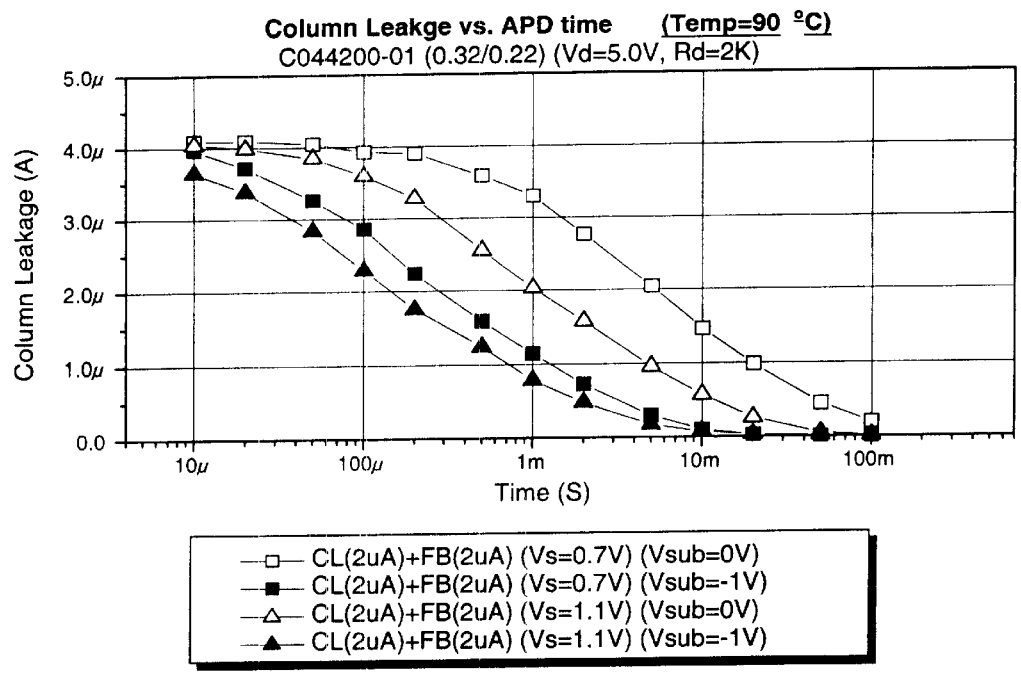
FIG. 19 shows a plot of the bitline leakage current versus APD (automatic program disturb) time for the column of flash memory cells of FIG. 17 operating at a temperature of about 90° Celsius.
Figure 20:
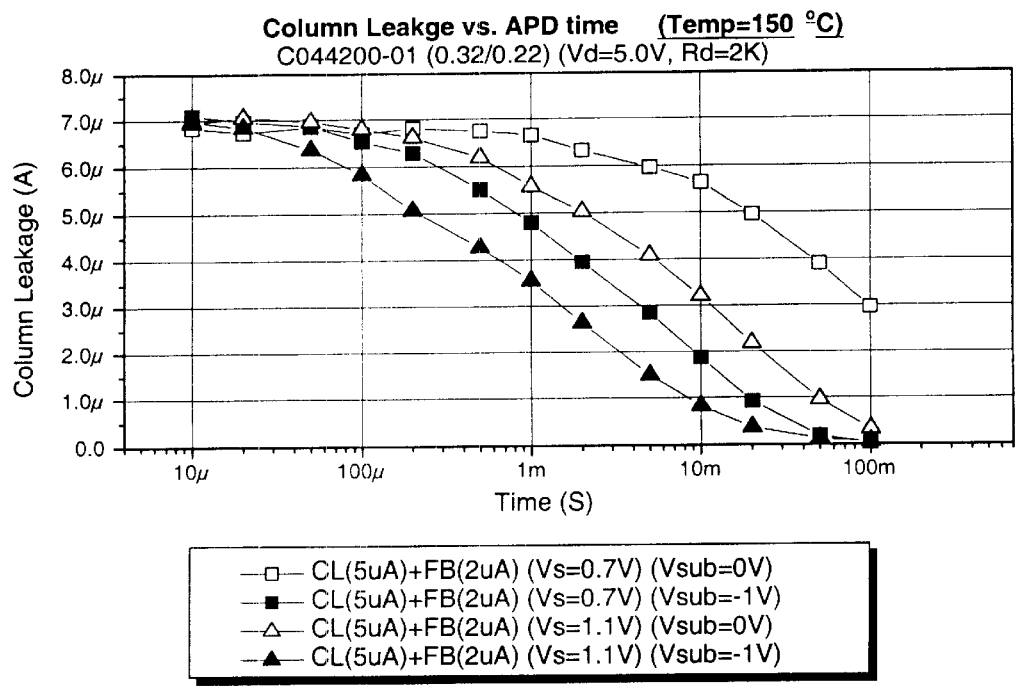
FIG. 20 shows a plot of the bitline leakage current versus APD (automatic program disturb) time for the column of flash memory cells of FIG. 17 operating at a temperature of about 150° Celsius.

FIG. 19 shows a plot of the column leakage current versus the APD time at a temperature of about 90° Celsius for various source voltages and various substrate voltages applied to the selected column of flash memory cells of FIG. 17. FIG. 20 shows a plot of the column leakage current versus the APD time at a temperature of about 150° Celsius for various source voltages and various substrate voltages applied to the selected column of flash memory cells of FIG. 17. FIGS. 19 and 20 illustrate that the column leakage current through the selected column of flash memory cells decreases with a higher APD time. In addition, in FIGS. 19 and 20, the APD time for achieving a column leakage current is lower when a substrate APDE voltage $V_{sub}$ of −1 Volts is applied than when a voltage of 0 Volts is applied to the substrates of the selected column of flash memory cells for various source voltages $V_s$.

Figure 18:
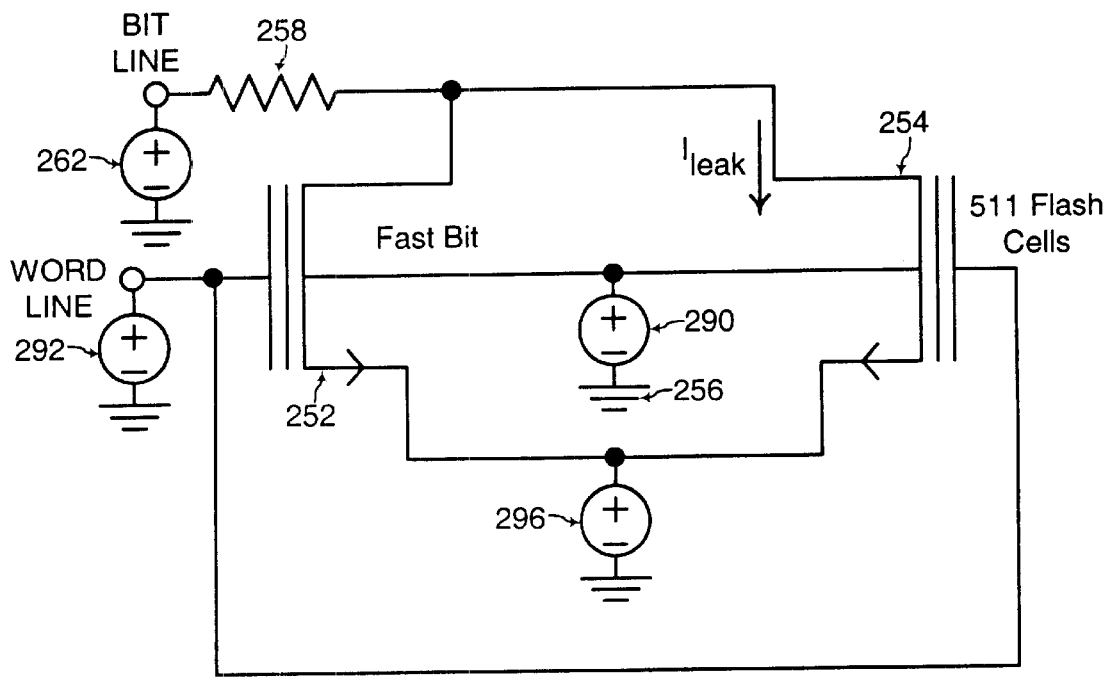
FIG. 18 shows a simplified circuit diagram of a column of flash memory cells illustrating the bitline current during an APDE (automatic program disturb after erase) operation with a positive voltage applied to the source, with a negative voltage applied to the substrate or p-well, and with an APDE voltage applied to the control gate of each flash memory cell of the column of flash memory cells, according to an embodiment of the present invention.

In FIG. 17, the source is feedback coupled to the control gate that is floating for each flash memory cell in the self-biasing configuration. Referring to FIG. 18, in another embodiment of the present invention, a control gate APDE voltage is directly applied on the respective word line for each flash memory cell in the selected column of flash memory cells. FIG. 18 shows the column of 512 flash memory cells selected to be erase-corrected at a given time during the APDE operation.

Comparing FIGS. 13 and 18, instead of the source resistor 260 of FIG. 13, the sources of the selected column of flash memory cells are coupled together and to the source voltage source 296. In one embodiment of the present invention, a bit line APDE voltage $V_D$ between about 4 and 6 volts is provided by the bit line voltage source 262 and is applied to the bit line terminal corresponding to the selected column of flash memory cells of FIG. 18. Furthermore, a source APDE voltage between 0.5 and 2 volts is provided by the source voltage source 296. In addition, a substrate APDE voltage $V_{sub}$ between −3 and −0.5 volts is provided by the substrate voltage source 290 and is applied to the substrates of the selected column of flash memory cells. Additionally, a control gate APDE voltage of about 0.5 Volts is provided by the control gate voltage source 292 and is applied to the respective word line coupled to each control gate of the selected column of flash memory cells.

Such APDE bias of FIG. 18 reduces or substantially eliminates the column leakage current while maintaining high APDE speed. The basic principle of the APDE operation of this embodiment of the present invention is to: (1) employ a relatively large source bias voltage during the APDE operation in order to back-bias the flash memory cells to reduce the column leakage current; and (2) employ a negative p-well or substrate bias in order to increase the lateral electric field of the flash memory cells, which maintains the fast APDE speed under the reduced $V_{DS}$ condition.

In this manner, the voltage formed at the source resistor or the source voltage applied to the source of the flash memory cell minimizes leakage current through a column of flash memory cells during the programming or APDE process. On the other hand, the negative substrate or p-well voltage enhances the lateral field in the channel of the flash memory cell to enhance the speed performance of the flash memory cells during the programming or APDE process.

The foregoing is by way of example only and is not intended to be limiting. For example, the present invention may be practiced with a larger array of more numerous flash memory cells. In addition, any specified material, or any specified dimensions, or any specified voltage levels described herein are by way of example only. Other materials, dimensions, and voltage levels may be used for practicing the present invention, as would be apparent to one of ordinary skill in the art of non-volatile flash memory devices from the description herein.

The present invention is limited only as defined in the following claims and equivalents thereof.

We claim:

1. A method for programing a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the method comprising the steps of:

selecting a flash memory cell of the array of multiple flash memory cells to be programmed;

applying a control gate programming voltage to the control gate of the selected flash memory cell;

applying a bit line programming voltage to the drain of the selected flash memory cell via the common bit line terminal to which the drain of the selected flash memory cell is connected;

coupling a source resistor to the common source terminal to which the source of the selected flash memory cell is connected; and applying a substrate programming voltage that is a negative voltage to the substrate of the selected flash memory cell, wherein said negative substrate programming voltage is applied simultaneously with said source resistor being coupled to said common source terminal to maintain programming speed with reduced $V_{DS}$ (drain to source voltage) of said selected flash memory cell from coupling of said source resistor to said common source terminal.

2. The method of claim 1, wherein the flash memory cells are comprised of N-channel field effect transistors, and wherein the substrate programming voltage applied on the substrate of the selected flash memory cell is in a range of from about negative 3 Volts to about negative 0.5 volts.

3. The method of claim 2, wherein the control gate programming voltage applied on the control gate of the selected flash memory cell is in a range of from about 7 and 10 volts, and wherein the bit line programming voltage applied on the common bit line terminal to which the drain of the selected flash memory cell is connected is in a range of from about 4 Volts to about 6 Volts.

4. The method of claim 2, wherein the control gate programming voltage applied on the control gate of the selected flash memory cell is in a range of from about 0.5 and 6.0 volts, and wherein the bit line programming voltage applied on the common bit line terminal to which the drain of the selected flash memory cell is connected is in a range of from about 4 Volts to about 6.0 Volts.

5. The method of claim 1, wherein the source resistor has a resistance value in a range of from about 2 kilo-ohms to about 50 kilo-ohms.

6. The method of claim 1, wherein the flash memory cells are comprised of N-channel field effect transistors, and wherein a substrate of each of the flash memory cells is comprised of a p-well.

7. A system for programming a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the system comprising:

means for selecting a flash memory cell of the array of multiple flash memory cells to be programmed;

a control gate voltage source for providing a control gate programming voltage applied to the control gate of the selected flash memory cell;

a bit line voltage source for providing a bit line programming voltage applied to the drain of the selected flash memory cell via the common bit line terminal to which the drain of the selected flash memory cell is connected;

a source resistor coupled to the common source terminal to which the source of the selected flash memory cell is connected; and a substrate voltage source for providing a substrate programming voltage that is a negative voltage applied to the substrate of the selected flash memory cell, wherein said negative substrate programming voltage is applied simultaneously with said source resistor being coupled to said common source terminal to maintain programming speed with reduced $V_{DS}$ (drain to source voltage) of said selected flash memory cell from coupling of said source resistor to said common source terminal.

8. The system of claim 7, wherein the flash memory cells are comprised of N-channel field effect transistors, and wherein the substrate programming voltage applied on the substrate of the selected flash memory cell is in a range of from about negative 3 Volts to about negative 0.5 volts.

9. The system of claim 8, wherein the control gate programming voltage applied on the control gate of the selected flash memory cell is in a range of from about 7 and 10 volts, and wherein the bit line programming voltage applied on the common bit line terminal to which the drain of the selected flash memory cell is connected is in a range of from about 4 Volts to about 6 Volts.

10. The system of claim 8, wherein the control gate programming voltage applied on the control gate of the selected flash memory cell is in a range of from about 0.5 and 6.0 volts, and wherein the bit line programming voltage applied on the common bit line terminal to which the drain of the selected flash memory cell is connected is in a range of from about 4 Volts to about 6.0 Volts.

11. The system of claim 7, wherein the source resistor has a resistance value in a range of from about 2 kilo-ohms to about 50 kilo-ohms.

12. The system of claim 7, wherein the flash memory cells are comprised of N-channel field effect transistors, and wherein a substrate of each of the flash memory cells is comprised of a p-well.

13. A method for performing an APDE (automatic program disturb after erase) process in a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the method comprising the steps of:

A. selecting a column of flash memory cells of the array of multiple flash memory cells to be erase-corrected;

B. applying a control gate APDE (automatic program disturb after erase) voltage to the respective control gate of each flash memory cell of the selected column of flash memory cells;

C. applying a bit line APDE (automatic program disturb after erase) voltage to the common bit line terminal corresponding to the selected column of flash memory cells;

D. coupling a source resistor to the common source terminal corresponding to the selected column of flash memory cells; and E. applying a substrate APDE (automatic program disturb after erase) voltage that is a negative voltage to the common substrate terminal corresponding to the selected column of flash memory cells, wherein said negative substrate APDE voltage is applied simultaneously with said source resistor being coupled to said common source terminal to maintain APDE (automatic program disturb after erase) speed with reduced $V_{DS}$ (drain to source voltage) of said selected column of flash memory cells from coupling of said source resistor to said common source terminal.

14. The method of claim 13, wherein the flash memory cells are comprised of N-channel field effect transistors, and wherein the substrate APDE voltage applied on the common substrate terminal corresponding to the selected column of flash memory cells is in a range of from about negative 3 Volts to about negative 0.5 volts.

15. The method of claim 14, wherein the control gate APDE voltage applied on the respective control gate of each flash memory cell of the selected column of flash memory cells is about 0.5 Volts, and wherein the bit line APDE voltage applied on the common bit line terminal corresponding to the selected column of flash memory cells is in a range of from about 4 Volts to about 6 Volts.

16. The method of claim 13, wherein the source resistor has a resistance value in a range of from about 2 kilo-ohms to about 50 kilo-ohms.

17. The method of claim 13, wherein the flash memory cells are comprised of N-channel field effect transistors, and wherein a substrate of each of the flash memory cells is comprised of a p-well.

18. The method of claim 13, wherein the source is coupled to the control gate for each flash memory cell in a self-biasing configuration, and wherein the control gate APDE voltage is not applied to the respective control gate of each flash memory cell of the selected column of flash memory cells.

19. The method of claim 13, further comprising the step of:

repeating the steps A, B, C, D, and E for each column of the array of flash memory cells.

20. A system for performing an APDE (automatic program disturb after erase) process in a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the system comprising:

means for selecting a column of flash memory cells of the array of multiple flash memory cells to be erase-corrected;

a control gate voltage source for providing an APDE (automatic program disturb after erase) voltage applied to the respective control gate of each flash memory cell of the selected column of flash memory cells;

a bit line voltage source for providing a bit line APDE (automatic program disturb after erase) voltage applied to the common bit line terminal corresponding to the selected column of flash memory cells;

a source resistor coupled to the common source terminal corresponding to the selected column of flash memory cells; and a substrate voltage source for providing a substrate APDE (automatic program disturb after erase) voltage that is a negative voltage applied to the common substrate terminal corresponding to the selected column of flash memory cells, wherein said negative substrate APDE voltage is applied simultaneously with said source resistor being coupled to said common source terminal to maintain APDE (automatic program disturb after erase) speed with reduced $V_{DS}$ (drain to source voltage) of said selected column of flash memory cells from coupling of said source resistor to said common source terminal.

21. The system of claim 20, wherein the flash memory cells are comprised of N-channel field effect transistors, and wherein the substrate APDE voltage applied on the common substrate terminal corresponding to the selected column of flash memory cells is in a range of from about negative 3 Volts to about negative 0.5 volts.

22. The system of claim 21, wherein the control gate APDE voltage applied on the respective control gate of each flash memory cell of the selected column of flash memory cells is about 0.5 Volts, and wherein the bit line APDE voltage applied on the common bit line terminal corresponding to the selected column of flash memory cells is in a range of from about 4 Volts to about 6 Volts.

23. The system of claim 20, wherein the source resistor has a resistance value in a range of from about 2 kilo-ohms to about 50 kilo-ohms.

24. The system of claim 20, wherein the flash memory cells are comprised of N-channel field effect transistors, and wherein a substrate of each of the flash memory cells is comprised of a p-well.

25. The system of claim 20, wherein the source is coupled to the control gate for each flash memory cell in a self-biasing configuration, and wherein the control gate APDE voltage is not applied to the respective control gate of each flash memory cell of the selected column of flash memory cells.

26. The system of claim 20, wherein each column of the array of flash memory cells is erase-corrected.

27. A method for performing an APDE (automatic program disturb after erase) process in a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the method comprising the steps of:

A. selecting a column of flash memory cells of the array of multiple flash memory cells to be erase-corrected;

B. applying a control gate APDE (automatic program disturb after erase) voltage to the respective control gate of each flash memory cell of the selected column of flash memory cells;

C. applying a bit line APDE (automatic program disturb after erase) voltage to the common bit line terminal corresponding to the selected column of flash memory cells;

D. applying a source APDE (automatic program disturb after erase) voltage that is a positive voltage to the common source terminal corresponding to the selected column of flash memory cells; and E. applying a substrate APDE (automatic program disturb after erase) voltage that is a negative voltage to the common substrate terminal corresponding to the selected column of flash memory cells, wherein said negative substrate APDE voltage is applied simultaneously with said positive source APDE voltage being applied on said common source terminal to maintain APDE (automatic program disturb after erase) speed with reduced $V_{DS}$ (drain to source voltage) of said selected column of flash memory cells from application of said positive source APDE voltage.

28. The method of claim 27, wherein the flash memory cells are comprised of N-channel field effect transistors, and wherein the substrate APDE voltage applied on the common substrate terminal corresponding to the selected column of flash memory cells is in a range of from about negative 3 Volts to about negative 0.5 volts.

29. The method of claim 28, wherein the control gate APDE voltage applied on the respective control gate of each flash memory cell of the selected column of flash memory cells is about 0.5 Volts, and wherein the bit line APDE voltage applied on the common bit line terminal corresponding to the selected column of flash memory cells is in a range of from about 4 Volts to about 6 Volts.

30. The method of claim 28, wherein the source APDE voltage applied on the common source terminal corresponding to the selected column of flash memory cells is in a range of from about 0.5 Volts to about 2 Volts.

31. The method of claim 28, wherein the flash memory cells are comprised of N-channel field effect transistors, and wherein a substrate of each of the flash memory cells is comprised of a p-well.

32. The method of claim 27, further comprising the step of:

repeating the steps A, B, C, D, and E for each column of the array of flash memory cells.

33. The method of claim 27, wherein the source is coupled to the control gate for each flash memory cell in a self-biasing configuration, and wherein the control gate APDE voltage is not applied to the respective control gate of each flash memory cell of the selected column of flash memory cells.

34. A system for performing an APDE (automatic program disturb after erase) process in a flash memory device having an array of multiple flash memory cells formed in rows and columns with a flash memory cell located at each intersection of a column and a row, and each flash memory cell having a control gate and a floating gate formed over a substrate, and each flash memory cell having a source and a drain formed in the substrate, wherein each of the drains of the flash memory cells in a column are coupled together as a common bit line terminal, and wherein each of the sources of the flash memory cells in a column are coupled together as a common source terminal, and wherein each of the substrates of the flash memory cells in a column are coupled together as a common substrate terminal, the system comprising:

means for selecting a column of flash memory cells of the array of multiple flash memory cells to be erase-corrected;

a control gate voltage source for providing a control gate APDE (automatic program disturb after erase) voltage applied to the respective control gate of each flash memory cell of the selected column of flash memory cells;

a bit line voltage source for providing a bit line APDE (automatic program disturb after erase) voltage applied to the common bit line terminal corresponding to the selected column of flash memory cells;

a source voltage source for providing a source APDE (automatic program disturb after erase) voltage that is a positive voltage applied to the common source terminal corresponding to the selected column of flash memory cells; and a substrate voltage source for providing a substrate APDE (automatic program disturb after erase) voltage that is a negative voltage applied to the common substrate terminal corresponding to the selected column of flash memory cells, wherein said negative substrate APDE voltage is applied simultaneously with said positive source APDE voltage being applied on said common source terminal to maintain APDE (automatic program disturb after erase) speed with reduced $V_{DS}$ (drain to source voltage) of said selected column of flash memory cells from application of said positive source APDE voltage.

35. The system of claim 34, wherein the flash memory cells are comprised of N-channel field effect transistors, and wherein the substrate APDE voltage applied on the common substrate terminal corresponding to the selected column of flash memory cells is in a range of from about negative 3 Volts to about negative 0.5 volts.

36. The system of claim 35, wherein the control gate APDE voltage applied on the respective control gate of each flash memory cell of the selected column of flash memory cells is about 0.5 Volts, and wherein the bit line APDE voltage applied on the common bit line terminal corresponding to the selected column of flash memory cells is in a range of from about 4 Volts to about 6 Volts.

37. The system of claim 34, wherein the source APDE voltage applied on the common source terminal corresponding to the selected column of flash memory cells is in a range of from about 0.5 Volts to about 2 Volts.

38. The system of claim 34, wherein the flash memory cells are comprised of N-channel field effect transistors, and wherein a substrate of each of the flash memory cells is comprised of a p-well.

39. The system of claim 34, wherein each column of the array of flash memory cells is erase-corrected.

40. The system of claim 34, wherein the source is coupled to the control gate for each flash memory cell in a self-biasing configuration, and wherein the control gate APDE voltage is not applied to the respective control gate of each flash memory cell of the selected column of flash memory cells.

41. A method of programming a flash memory device having multiple flash memory cells formed in rows and columns with a flash memory cell located at each intersection of a column and a row and each flash memory cell having a control gate and a floating gate formed over a substrate and each flash memory cell having a source and a drain formed in the substrate, wherein the drains in each column have a common terminal and wherein the sources have a common terminal and wherein the substrates have a common terminal, the method comprising:

selecting a cell to be programmed;

applying a selected programming voltage between 7 and 10 volts to the control gate of the selected cell to be programmed;

applying a selected programming voltage between 4 and 6.0 volts to the drain of the selected cell to be programmed via the common terminal to which the drain of the selected cell is connected;

applying a selected programming voltage between 0.5 and 2.0 volts to the sources of all the flash memory cells; and applying a selected programming voltage between minus 2 and minus 0.5 volts to the substrates of all the flash memory cells.

42. The method of claim 41 wherein the selected programming voltages are determined during a precharacterization procedure.

43. The method of claim 42 wherein the precharacterization procedure is a computer modeling characterization procedure.

44. The method of claim 42 wherein the precharacterization procedure is an empirical characterization procedure.

45. A method of soft programming a flash memory device having multiple flash memory cells formed in rows and columns with a flash memory cell located at each intersection of a column and a row and each flash memory cell having a control gate and a floating gate formed over a substrate and each flash memory cell having a source and a drain formed in the substrate, wherein the drains in each column have a common terminal and wherein the sources have a common terminal and wherein the substrates have a common terminal, the method comprising:

applying soft programming voltages to the drains, sources and control gates of selected memory cells, wherein the soft programming voltages are as follows:

a voltage between 4 and 5.5 volts applied to the drains of the selected memory cells;

a voltage between minus 2.0 volts and minus 0.5 volts applied to the substrates of the selected memory cells;

a voltage between 0.5 volts and 4.5 volts applied to the control gates of the selected memory cells; and a voltage between 0.5 volts and 2 volts is applied to the sources of the selected memory cells.

46. The method of claim 45 wherein the selected soft programming voltages are determined during a precharacterization procedure.

47. The method of claim 46 wherein the precharacterization procedure is a computer modeling characterization procedure.

48. The method of claim 46 wherein the precharacterization procedure is an empirical characterization procedure.

* * * * *